United States Patent
Yu et al.

(10) Patent No.: US 10,797,163 B1
(45) Date of Patent: Oct. 6, 2020

(54) LEAKAGE CONTROL FOR GATE-ALL-AROUND FIELD-EFFECT TRANSISTOR DEVICES

(71) Applicant: International Business Machines Corporation, Armonk, NY (US)

(72) Inventors: Lan Yu, Voorheesville, NY (US); Heng Wu, Guilderland, NY (US); Ruqiang Bao, Niskayuna, NY (US); Junli Wang, Slingerlands, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/396,890

(22) Filed: Apr. 29, 2019

(51) Int. Cl.
*H01L 21/762* (2006.01)
*H01L 29/66* (2006.01)
(Continued)

(52) U.S. Cl.
CPC .. *H01L 29/66795* (2013.01); *H01L 21/02164* (2013.01); *H01L 21/02238* (2013.01);
(Continued)

(58) Field of Classification Search
CPC ............ H01L 29/0673; H01L 21/76267
See application file for complete search history.

(56) References Cited

U.S. PATENT DOCUMENTS 5,061,642 A * 10/1991 Fujioka ............. H01L 21/26533
438/766
8,987,794 B2 * 3/2015 Rachmady ............ H01L 29/045
257/288
(Continued)

FOREIGN PATENT DOCUMENTS

CN 108695230 A 10/2018
DE 102018205057 A1 10/2018

OTHER PUBLICATIONS

M. Osada et al., "Two-Dimensional Dielectric Nanosheets: Novel Nanoelectronics From Nanocrystal Building Blocks," Advanced Materials, Jan. 10, 2012, pp. 210-228, vol. 24, No. 2 (Abstract only).
(Continued)

*Primary Examiner* — Mark V Prenty
(74) *Attorney, Agent, or Firm* — Vazken Alexanian; Ryan, Mason & Lewis, LLP

(57) ABSTRACT

Techniques are provided to fabricate embedded insulating layers within an active semiconductor layer of substrate to reduce leakage between field-effect transistor devices and the semiconductor substrate. For example, an epitaxial semiconductor layer is formed on a surface of a semiconductor substrate. An ion implantation process is performed to form an embedded insulation layer within the semiconductor substrate below the epitaxial semiconductor layer. A nanosheet field-effect transistor device is formed over the embedded insulation layer. The nanosheet field-effect transistor device includes active nanosheet channel layers, source/drain layers, and a high-k dielectric/metal gate structure formed around the active nanosheet channel layers. The process of forming the nanosheet field-effect transistor device includes removing the epitaxial semiconductor layer to release the active nanosheet channel layers. The embedded insulation layer isolates the high-k dielectric/metal gate structure and the source/drain layers from the semiconductor substrate.

19 Claims, 17 Drawing Sheets

(51) Int. Cl.
*H01L 21/02* (2006.01)
*H01L 29/06* (2006.01)
*H01L 29/10* (2006.01)
*H01L 29/08* (2006.01)
*H01L 29/423* (2006.01)
*H01L 21/3065* (2006.01)
*H01L 29/78* (2006.01)
*H01L 21/311* (2006.01)

(52) U.S. Cl.
CPC .. *H01L 21/02255* (2013.01); *H01L 21/02532* (2013.01); *H01L 21/3065* (2013.01); *H01L 21/76243* (2013.01); *H01L 29/0673* (2013.01); *H01L 29/0847* (2013.01); *H01L 29/1033* (2013.01); *H01L 29/42392* (2013.01); *H01L 29/6656* (2013.01); *H01L 29/66545* (2013.01); *H01L 29/66553* (2013.01); *H01L 29/785* (2013.01); *H01L 21/0217* (2013.01); *H01L 21/31111* (2013.01)

(56) References Cited

U.S. PATENT DOCUMENTS

| | | | |
|---|---|---|---|
| 9,570,609 | B2 | 2/2017 | Obradovic et al. |
| 9,947,804 | B1 | 4/2018 | Frougier et al. |
| 2008/0135949 | A1* | 6/2008 | Lo .................... B82Y 10/00 257/401 |
| 2018/0308988 | A1 | 10/2018 | Chao et al. |
| 2018/0342427 | A1 | 11/2018 | Xie et al. |
| 2019/0237360 | A1* | 8/2019 | Reznicek .......... H01L 29/66545 |

OTHER PUBLICATIONS

Disclosed Anonymously, "Integration of Bottom Isolated Nanosheet with Long Channel Bulk FinFET," IP.com No. IPCOM000254274D, Jun. 14, 2018, 6 pages.

Disclosed Anonymously, "Side-Anchoring Silicon-on-Nothing," IP.com No. IPCOM000250006D, May 15, 2017, 6 pages.

* cited by examiner

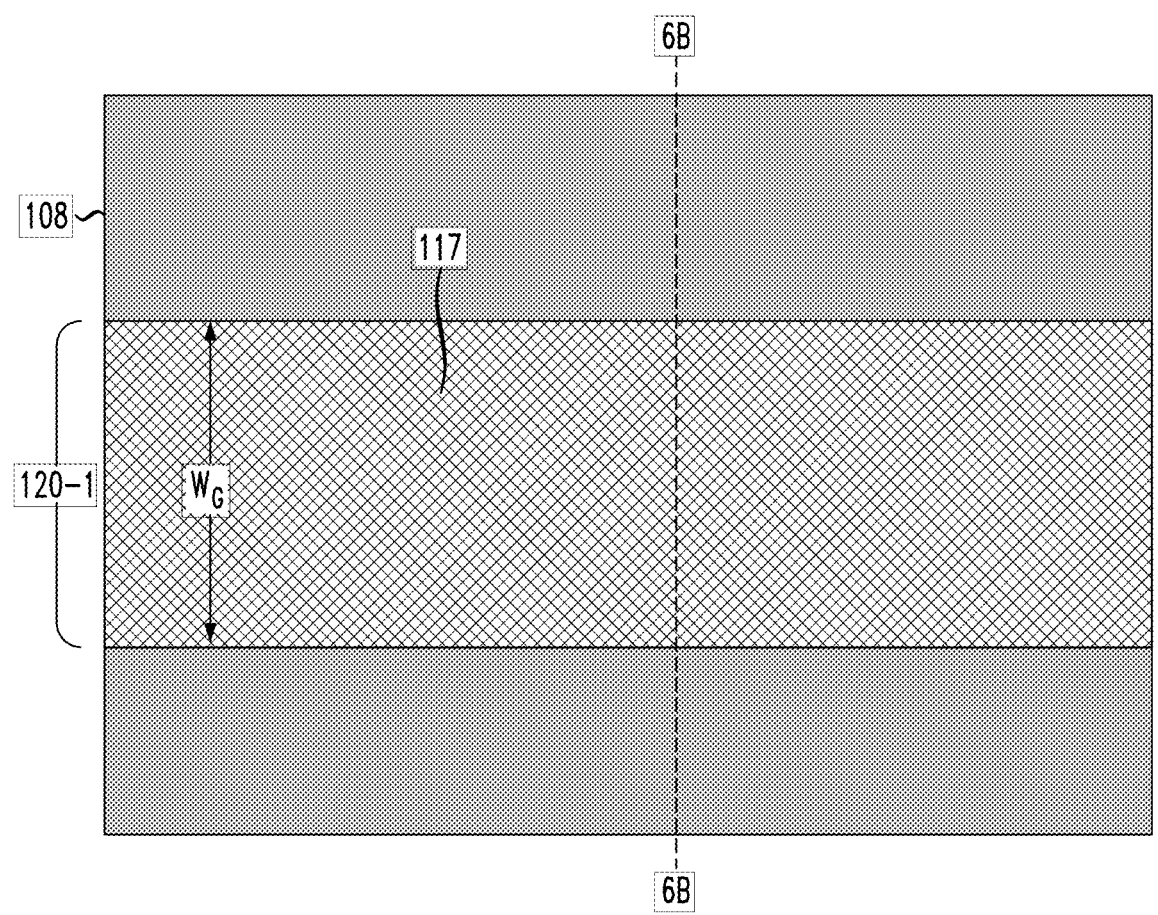

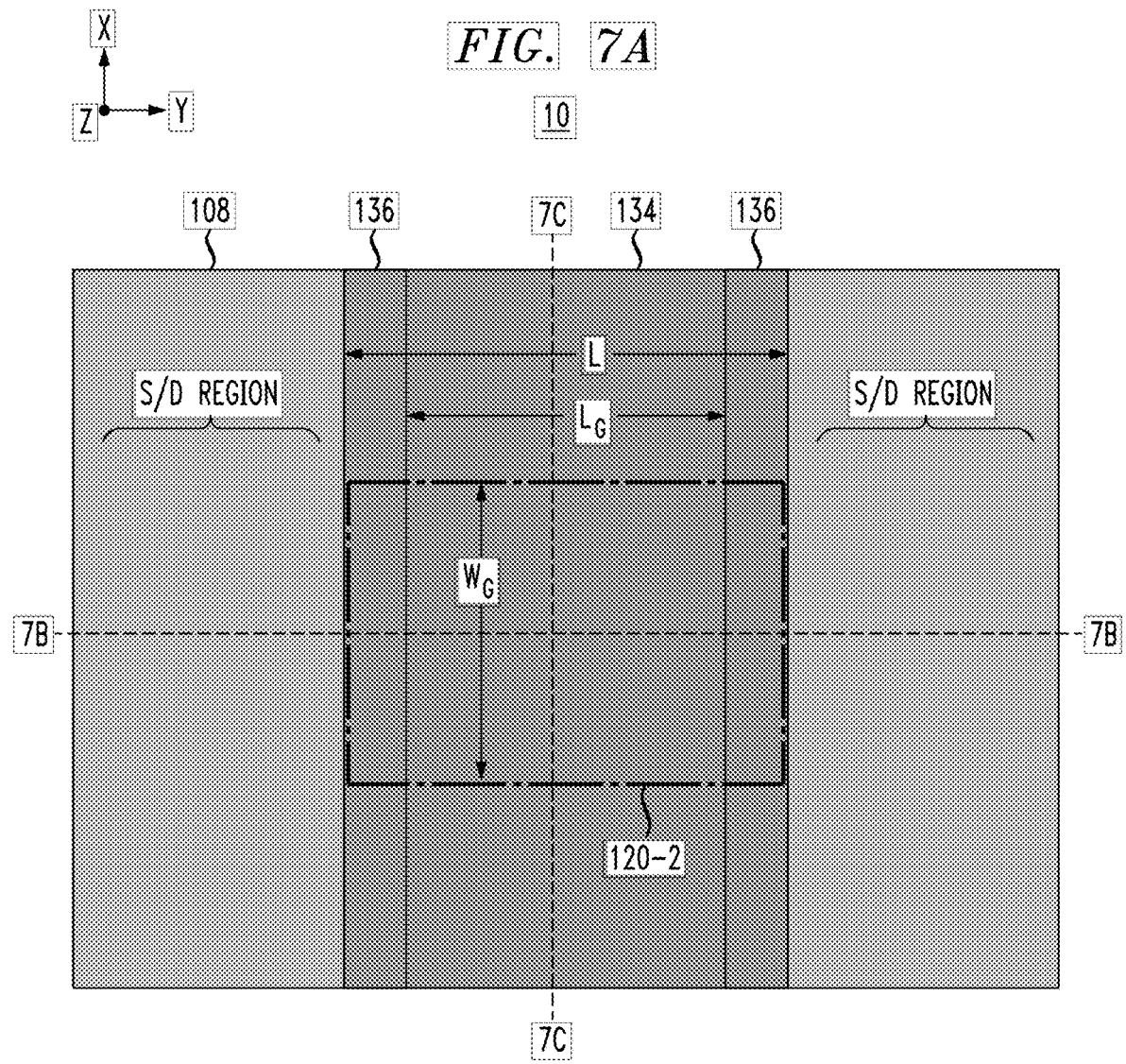

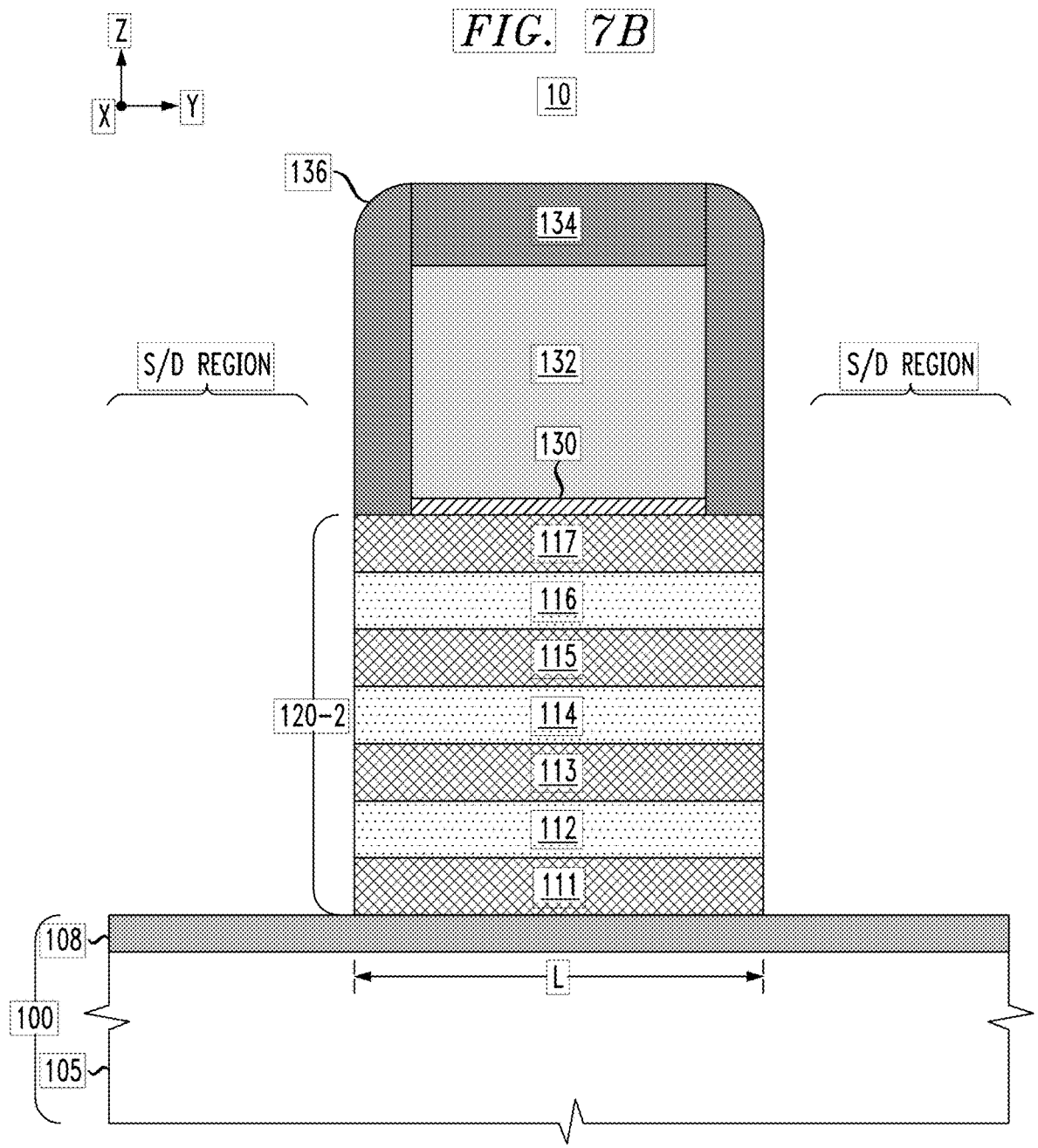

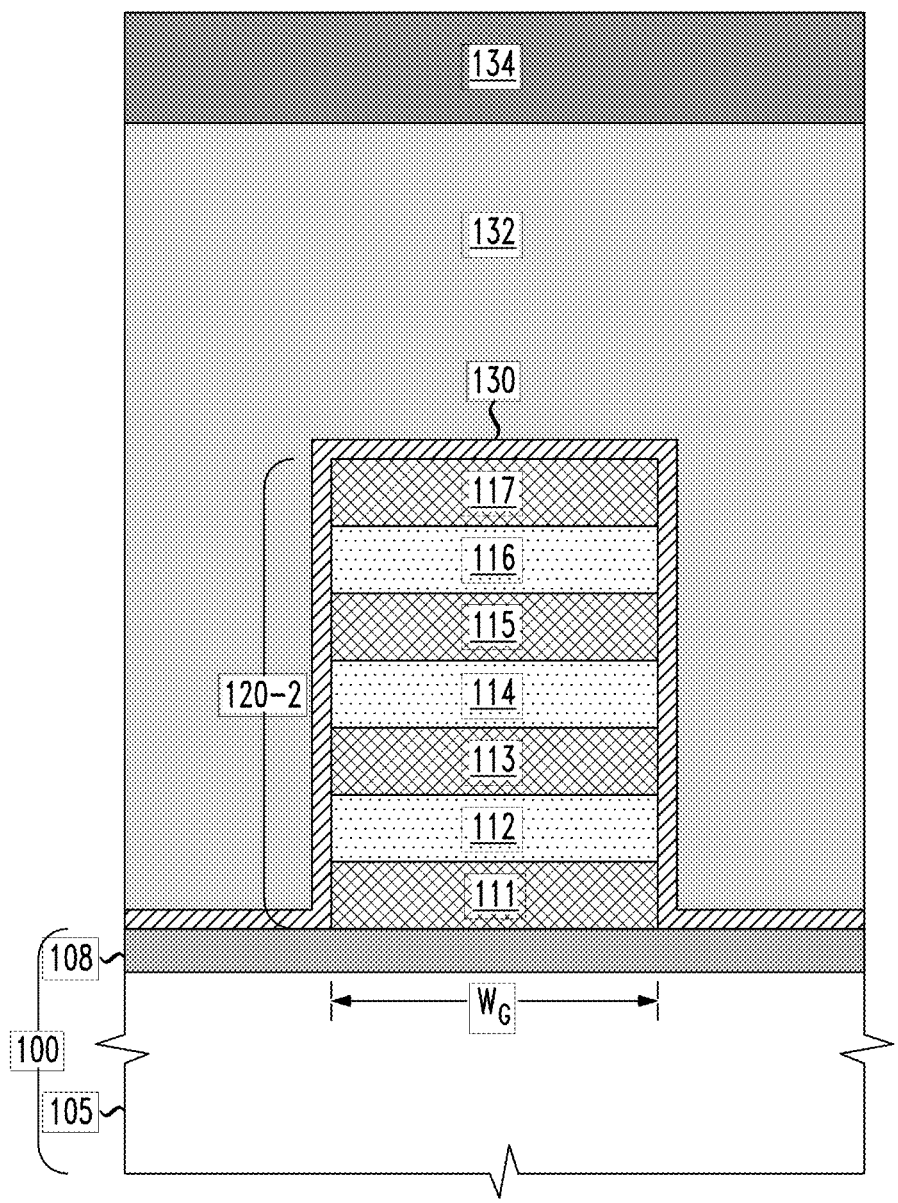

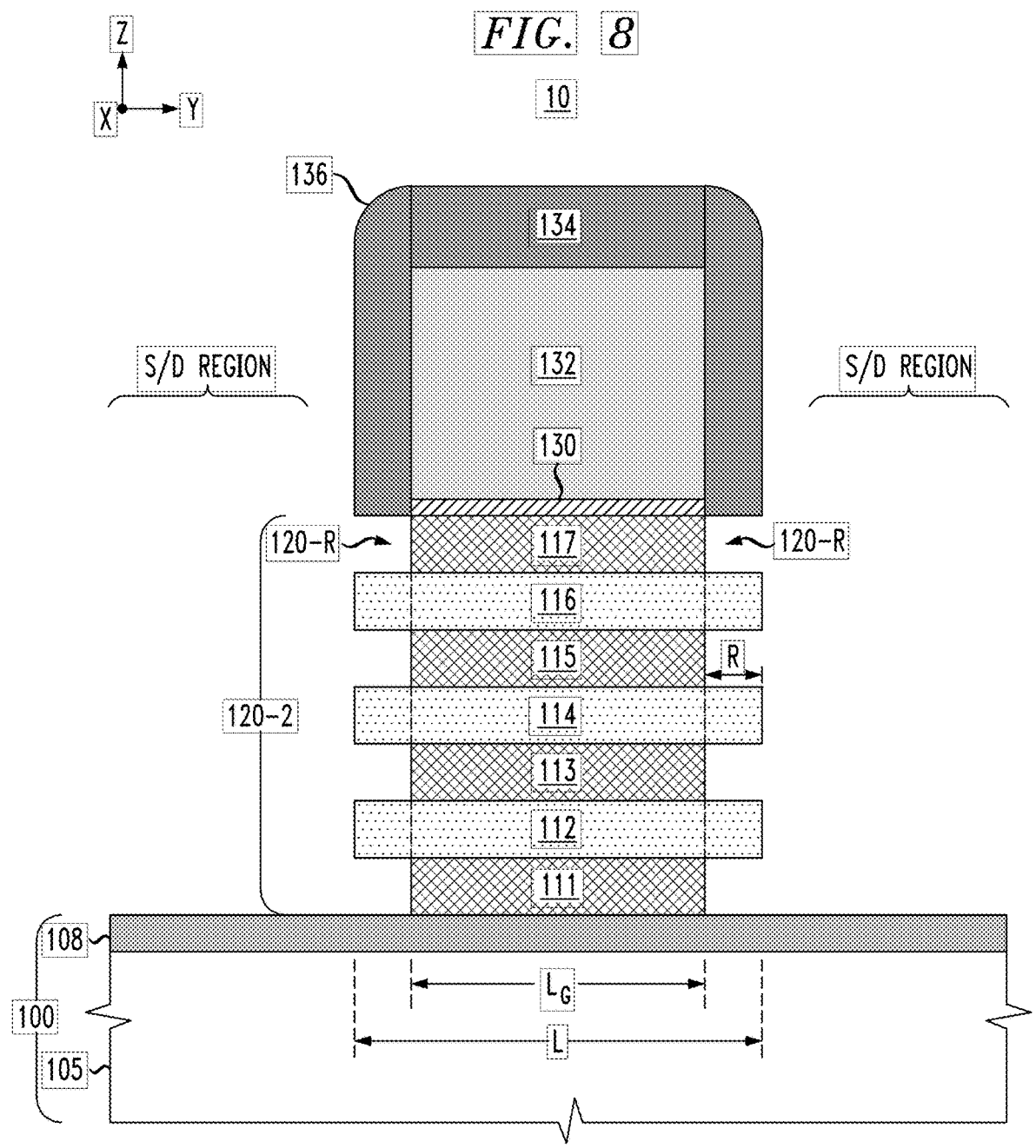

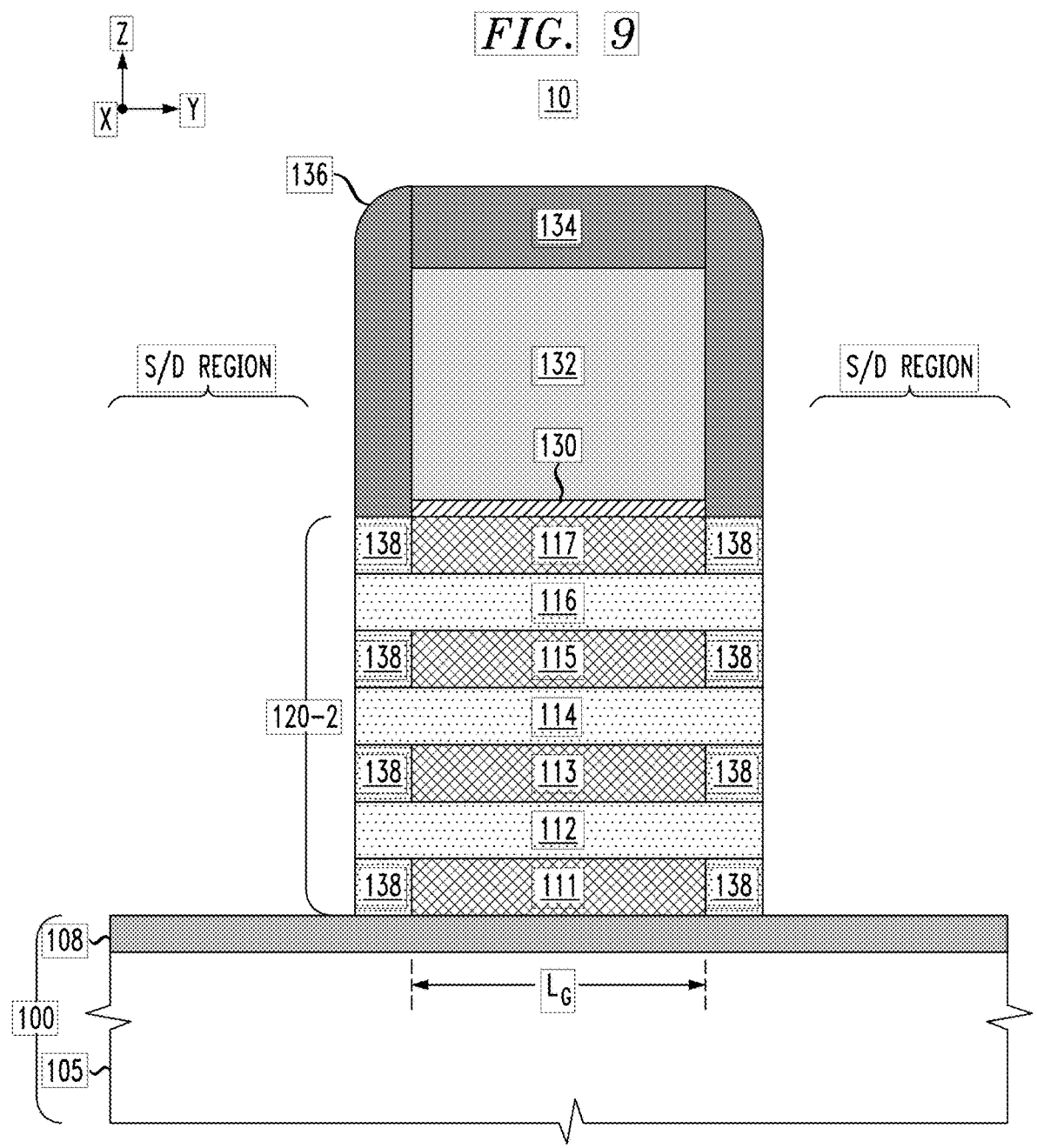

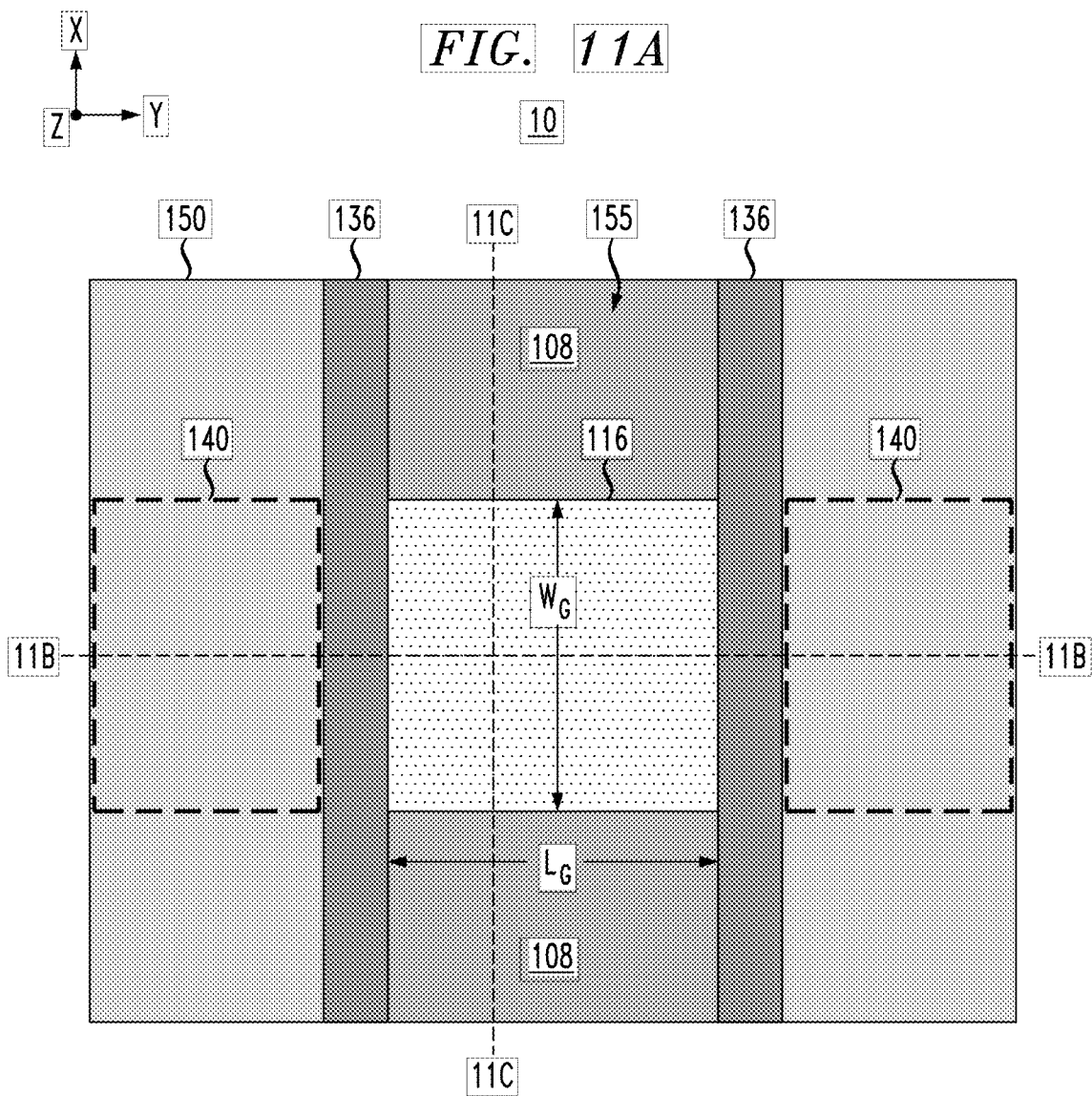

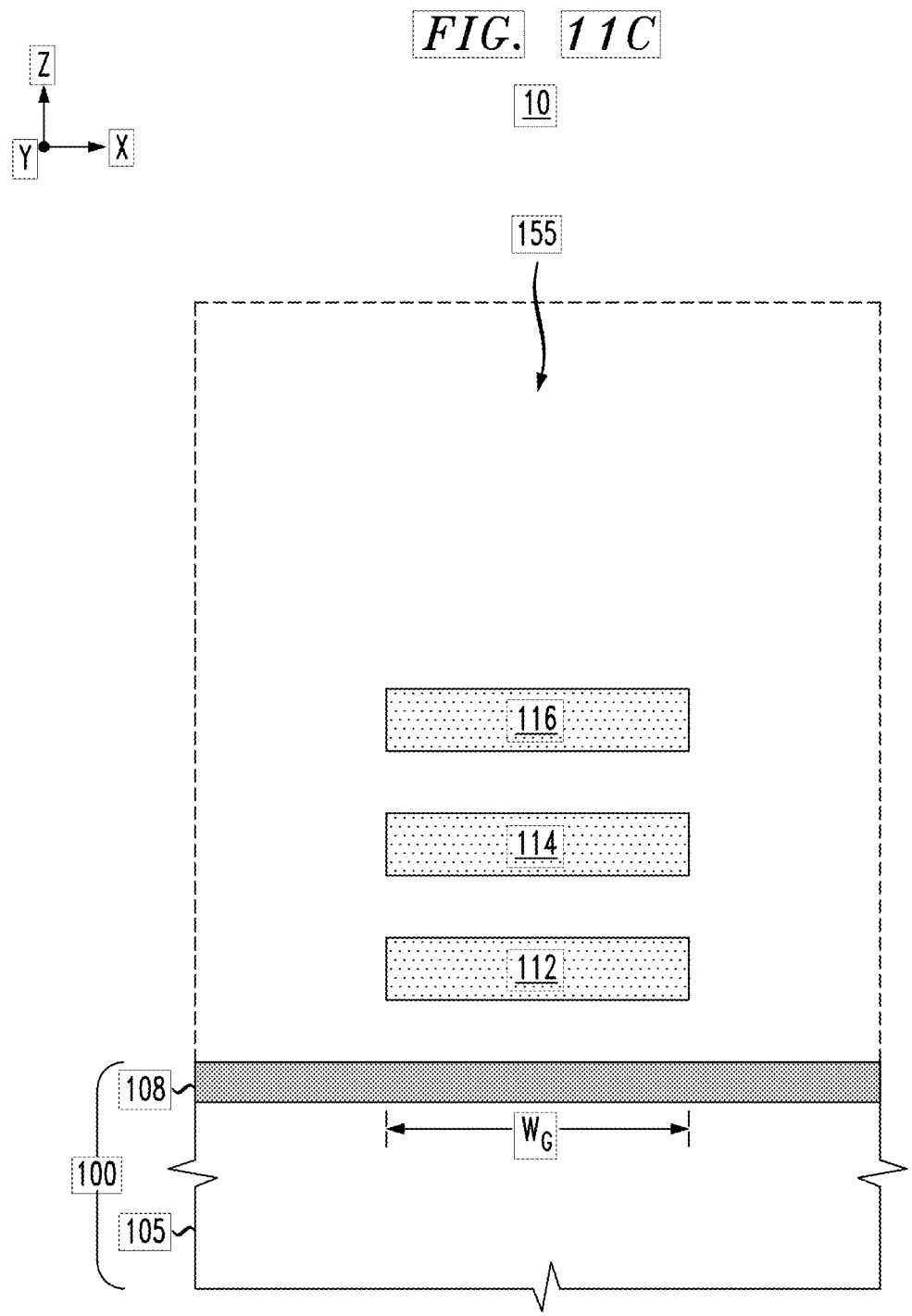

LEAKAGE CONTROL FOR GATE-ALL-AROUND FIELD-EFFECT TRANSISTOR DEVICES

TECHNICAL FIELD

This disclosure relates generally to semiconductor fabrication techniques and, in particular, to structures and methods for fabricating gate-all-around (GAA) field-effect transistor (FET) devices such as nanosheet FET devices.

BACKGROUND

Continued innovations in semiconductor process technologies are enabling higher integration densities and device scaling. As the semiconductor industry moves towards the 7-nm technology node and beyond, semiconductor FET device structures must be scaled to smaller dimensions to provide increased device width per footprint area. In this regard, non-planar FET devices such as nanosheet FET devices, nanowire FET devices, vertical FET devices, FinFET devices, etc., are a viable option for continued CMOS scaling. In general, a nanowire FET device comprises a device channel which comprises one or more nanowire layers in a stacked configuration, wherein each nanowire comprises an elongated semiconductor layer that has a width which is substantially the same or slightly larger than a thickness of the elongated semiconductor layer. A nanosheet FET device is similar to a nanowire FET device sheet in that a device channel comprises one or more nanosheet layers in a stacked configuration, but wherein each nanosheet layer has a width which is substantially greater than a thickness of the nanosheet layer. In GAA FET devices such as nanowire/nanosheet FET devices, the gate material is formed to surround all sides of the active channel layers of such FET devices. In addition, with nanowire/nanosheet FET devices, a common gate structure is formed above and below each nanowire/nanosheet layer in the stacked configuration, thereby increasing the FET device width (or channel width), and thus the drive current, for a given footprint area.

One issue with nanosheet FET technology is the ability to effectively isolate nanosheet FET devices from an underlying semiconductor substrate. For example, with insufficient isolation, device performance will degrade as a result of increased source/drain leakage to the underlying substrate and increased parasitic capacitance and leakage between a metal gate structure and the underlying substrate.

SUMMARY

Embodiments of the invention include methods for fabricating a semiconductor integrated circuit device comprising FET devices (e.g., nanosheet FET devices) and embedded insulation layers within an active semiconductor layer of a semiconductor substrate to provide reduced parasitic capacitance and leakage between the FET devices and the underlying semiconductor substrate.

For example, in one exemplary embodiment, a first epitaxial semiconductor layer is formed on a surface of a semiconductor substrate. An ion implantation process is performed to form an embedded insulation layer within the semiconductor substrate below the first epitaxial semiconductor layer. A nanosheet field-effect transistor device is formed over the embedded insulation layer, wherein the nanosheet field-effect transistor device comprises a plurality of active nanosheet channel layers, source/drain layers in contact with end portions of the active nanosheet channel layers, and a high-k dielectric/metal gate structure formed around the active nanosheet channel layers. The process of forming the nanosheet field-effect transistor device comprises removing the first epitaxial semiconductor layer to release the active nanosheet channel layers. The embedded insulation layer isolates the high-k dielectric/metal gate structure and the source/drain layers from the semiconductor substrate.

In another embodiment, a first epitaxial semiconductor layer is formed on an active silicon layer of a semiconductor substrate. A screening layer is formed over the first epitaxial semiconductor layer. An oxygen ion implantation process is performed to form an embedded oxide layer within the active silicon layer below the first epitaxial semiconductor layer. An etch process is performed to remove the screening layer selective to the first epitaxial semiconductor layer. A nanosheet layer stack is formed over the embedded insulation layer. The nanosheet layer stack comprises a plurality of epitaxial semiconductor layers comprising sacrificial nanosheet layers and active nanosheet channel layers, wherein the first epitaxial semiconductor layer comprises a sacrificial nanosheet layer of the nanosheet layer stack. The nanosheet layer stack is patterned down to the embedded oxide layer to thereby form a nanosheet stack structure which is disposed on the embedded oxide layer. Source/drain layers are formed in contact with exposed sidewall surfaces of the active nanosheet channel layers of the nanosheet stack structure. The sacrificial nanosheet layers of the nanosheet stack structure are selectively etched to release the active nanosheet channel layers. A high-k dielectric/metal gate structure is formed to surround the active nanosheet channel layers. The embedded oxide layer isolates the high-k dielectric/metal gate structure and the source/drain layers from the semiconductor substrate.

Another exemplary embodiment includes a semiconductor integrated circuit device. The semiconductor integrated circuit device comprises a semiconductor substrate comprising an active semiconductor layer. The active semiconductor layer comprises an embedded oxide layer disposed within an upper surface region of the active semiconductor layer. A field-effect transistor device is disposed on the embedded oxide layer. The field-effect transistor device comprises a nanosheet stack structure comprising a plurality of active nanosheet channel layers, a high-k dielectric/metal gate structure surrounding the active nanosheet channel layers, and source/drain layers disposed in contact with end portions of the active nanosheet channel layers. The embedded oxide layer isolates the high-k dielectric/metal gate structure and the source/drain layers from the active semiconductor layer of the semiconductor substrate.

Other embodiments will be described in the following detailed description of embodiments, which is to be read in conjunction with the accompanying figures.

BRIEF DESCRIPTION OF THE DRAWINGS

FIGS. 1A and 1B are schematic views of a semiconductor integrated circuit (IC) device comprising a nanosheet FET device and an embedded insulation layer for reduced leakage between the nanosheet FET device and an underlying semiconductor substrate, according to an embodiment of the invention, wherein:

FIG. 1A is a schematic cross-sectional side view of the semiconductor IC device showing a structure of the nanosheet FET device along a gate length direction of the nanosheet FET device; and FIG. 1B is a schematic cross-sectional side view of the semiconductor IC device along line 1B-1B shown in FIG. 1A, which illustrates the structure of the nanosheet FET device along a gate width direction of the nanosheet FET device.

FIGS. 2-12B schematically illustrate a method for fabricating a semiconductor IC device comprising a nanosheet FET device and an embedded insulation layer for reduced leakage between the nanosheet FET device and an underlying semiconductor substrate, according to an embodiment of the invention, wherein:

FIG. 2 is a schematic cross-sectional side view of the semiconductor IC device at an initial stage of fabrication comprising a semiconductor substrate, a sacrificial nanosheet layer formed over the semiconductor substrate, and screening layers formed over the sacrificial nanosheet layer;

FIG. 3 is a schematic cross-sectional side view of the semiconductor IC device shown in FIG. 2 during an oxygen ion implantation process that is performed to implant oxygen ions into the upper region of an active semiconductor layer of the semiconductor substrate to form an oxygen ion implant region;

FIG. 4 is a schematic cross-sectional side view of the semiconductor IC device shown in FIG. 3 after performing a thermal anneal process to convert the oxygen ion implant region into an embedded silicon oxide layer which forms the embedded insulation layer, and after removing the screening layers;

FIG. 5 is a schematic cross-sectional side view of the semiconductor IC device of FIG. 4 after forming a nanosheet layer stack over the embedded insulation layer;

FIG. 6A is a top plan schematic view of the semiconductor IC device of FIG. 5 after patterning the nanosheet layer stack to form an elongated nanosheet stack structure with a defined gate width;

FIG. 7A is a top plan view of the semiconductor IC device of FIG. 6A after forming a dummy gate structure which overlaps a portion of the elongated nanosheet stack structure, and after patterning exposed portions of the elongated nanosheet stack structure in source/drain regions adjacent to the dummy gate structure to form a nanosheet stack structure with a defined length;

FIG. 7B is a schematic cross-sectional side view of the semiconductor IC device along line 7B-7B shown in FIG. 7A;

FIG. 7C is a schematic cross-sectional side view of the semiconductor IC device along line 7C-7C shown in FIG. 7A;

FIG. 8 is a schematic cross-sectional side view of the semiconductor IC device shown in FIG. 7B after laterally recessing exposed sidewall surfaces of the sacrificial nanosheet layers of the nanosheet stack structure to form recessed regions in the sidewalls of the nanosheet stack structure;

FIG. 9 is a schematic cross-sectional side view of the semiconductor IC device shown in FIG. 8 after forming embedded gate sidewall spacers within the recessed regions in the sidewalls of the nanosheet stack structure;

FIG. 10 is a schematic cross-sectional side view of the semiconductor IC device of FIG. 9 after forming source/drain layers of the nanosheet FET device and forming an insulating layer to cover the nanosheet FET device;

FIG. 11A is a schematic top plan view of the semiconductor IC device of FIG. 10 after removing a dummy gate capping layer and dummy gate sacrificial layers, and after removing the sacrificial nanosheet layers to release the active nanosheet channel layers of the nanosheet stack structure to form an open gate region;

FIG. 11C is a schematic cross-sectional side view of the semiconductor IC device along line 11C-11C shown in FIG. 11A;

FIG. 12B is a schematic cross-sectional side view of the semiconductor IC device along line 12B-12B shown in FIG. 12A.

DETAILED DESCRIPTION

Figure 1A:
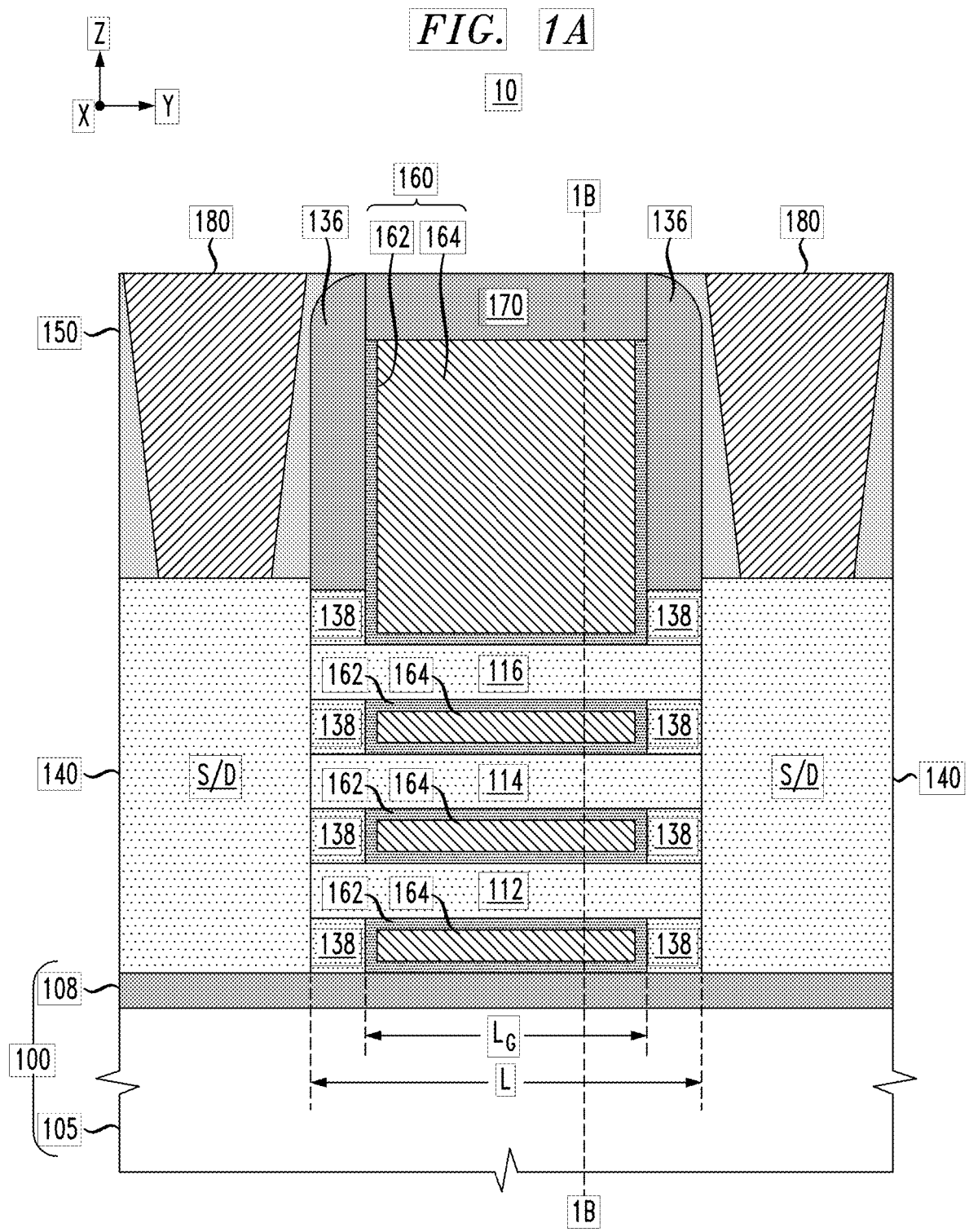

Embodiments of the invention will now be described in further detail with regard to methods for fabricating a semiconductor IC device comprising FET devices and embedded insulation layers that are formed within an active semiconductor layer of a semiconductor substrate to provide reduced parasitic capacitance and leakage between the FET devices and the underlying semiconductor substrate. For illustrative purposes, exemplary embodiments of the invention will be discussed in the context of nanosheet FET devices, but it is to be understood that the fabrication techniques discussed herein are readily applicable to various types of gate-all-around FET devices such as nanowire FETs, and other types of GAAFET devices having gate structures that are formed around all sides of active channel layers.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g. the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface.

To provide spatial context to the different structural orientations of the semiconductor structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 1B:
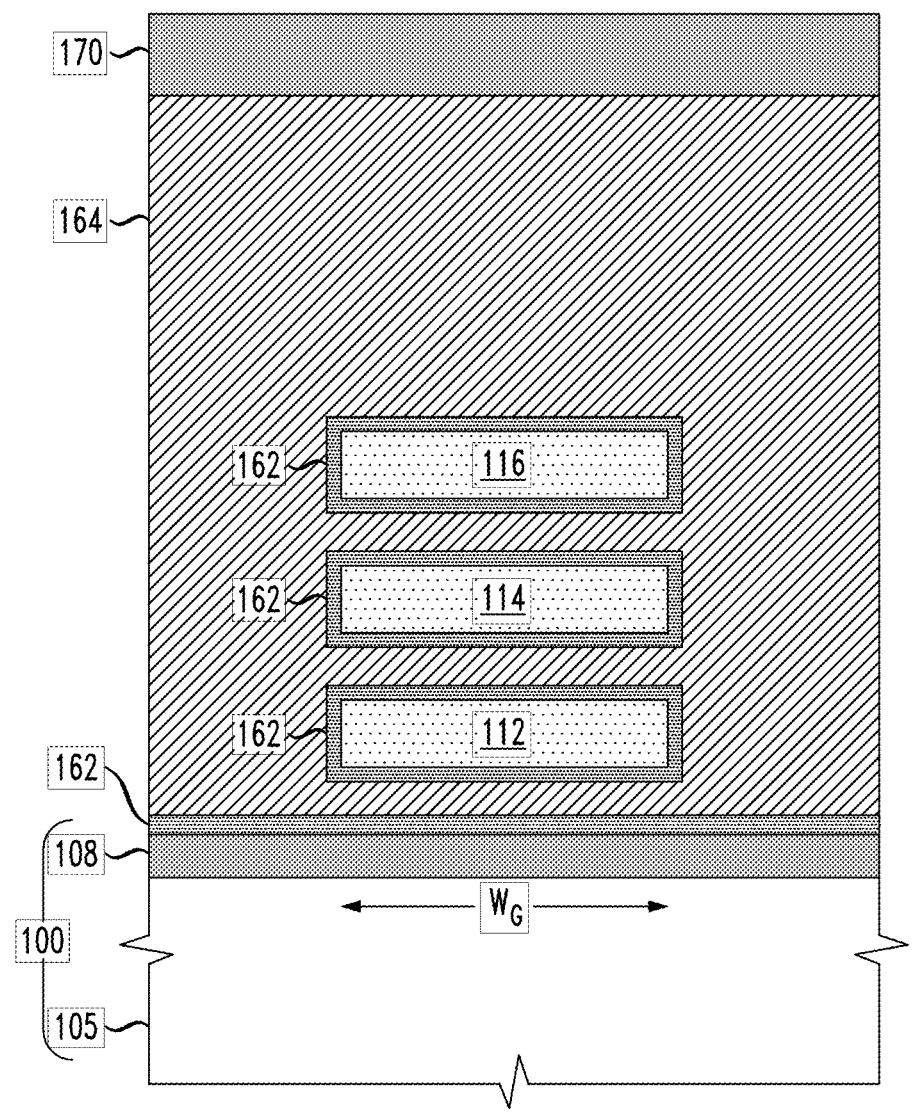

FIGS. 1A and 1B are schematic views of a semiconductor IC device 10 comprising a nanosheet FET device and an embedded insulation layer for reduced leakage between the nanosheet FET device and an underlying semiconductor substrate, according to an embodiment of the invention. In particular, FIG. 1A is a schematic cross-sectional side view (Y-Z plane) of the semiconductor IC device 10 showing a structure of the nanosheet FET device along a gate length ($L_G$) direction of the nanosheet FET device, and FIG. 1B is a schematic cross-sectional side view (Y-Z plane) of the semiconductor IC device 10 along line 1B-1B shown in FIG. 1A, which illustrates the structure of the nanosheet FET device along a gate width ($W_G$) direction of the nanosheet FET device. As illustrated in FIGS. 1A and 1B, the semiconductor IC device 10 comprises a substrate 100 which includes an active semiconductor layer 105 and an embedded insulation layer 108. The nanosheet FET device comprises a stack of active nanosheet channel layers 112, 114, and 116, source/drain (S/D) layers 140, and a gate structure comprising gate sidewall spacers 136 and 138, a high-k dielectric/metal gate (HKMG) structure 160, and a gate capping layer 170. The semiconductor IC device 10 further comprises an insulating layer 150 (e.g., an interlayer dielectric (ILD) layer or a PMD (pre-metal dielectric) layer), and vertical source/drain contacts 180, which are formed as part of a middle-of-the-line (MOL) layer of the semiconductor IC device 10. It is to be understood that the term "source/drain region" as used herein means that a given source/drain region can be either a source region or a drain region, depending on the application or circuit configuration.

As further shown in FIGS. 1A and 1B, the gate sidewall spacers 136 and 138 define a gate region of the nanosheet FET device which surrounds/contains the HKMG structure 160. The gate sidewall spacer 136 serves to electrically insulate the HKMG structure 160 from surrounding elements (e.g., the S/D layers 140, the ILD layer 150, the vertical S/D contacts 180, etc.). Further, the gate sidewall spacers 138 comprise embedded gate sidewall spacers (or internal spacers) which are formed between end portions of the active nanosheet channel layers 112, 114, and 116 and serve to insulate the HKMG structure 160 from the source/drain layers 140.

The HKMG structure 160 comprises a gate dielectric layer 162 and a metal gate structure 164. The gate dielectric layer 162 comprises one or more conformally deposited layers of high-k dielectric material (e.g., HfO2, HfSiO, HfZrO, and/or nitrided films thereof). In some embodiments, a thin interfacial silicon oxide layer is formed on the epitaxial silicon surfaces of the active nanosheet channel layers 112, 114, and 116 prior to forming the high-k gate dielectric layer 162. In some embodiments, the metal gate structure 164 comprises one or more work function metal (WFM) layers which are formed to achieve a target threshold voltage for the nanosheet FET device, and a metal layer that fills the gate region to form a metal gate electrode.

For example, the WFM layers may comprise a layer of titanium nitride (TiN) and a layer of an aluminum (Al) containing alloy material such as titanium aluminum carbide (TiAlC), TiAl, AlC, etc. In addition, a metallic gate electrode can be formed by filling the remaining portion of the gate region with a low resistance metallic material such as tungsten, cobalt, ruthenium, etc. In some embodiments, the metal gate electrode is formed by filling the gate region with one or more of the work function metals used to form the WFM layer(s) such that the entire metal gate 164 is formed of one or more WFM layers. As schematically illustrated in FIGS. 1A and 1B, the HKMG structure 160 is formed to surround all sides (top, bottom, sidewalls) of the active channel layers 112, 114, and 116 to provide a GAA FET structure.

In one embodiment, the active nanosheet channel layers 112, 114, and 116 are formed of an epitaxial semiconductor material such as epitaxial silicon and have a same thickness, length (L), and a same width which defines a gate width $W_G$ of the nanosheet FET device. As shown in FIG. 1A, the portions of the active nanosheet channel layers 112, 114 and 116 which are overlapped/surrounded by the HKMG structure 160 define the gate length $L_G$ (or channel length) of the nanosheet FET device, although the active nanosheet channel layers 112, 114, and 116 are physically longer (length L) than the gate length $L_G$.

In accordance with embodiments of the invention, the embedded insulation layer 108 comprises an oxide layer that is embedded within an upper surface of the active semiconductor layer 105. The embedded insulation layer 108 provides isolation between the source/drain layers 140 and the underlying active semiconductor layer 105, as well as isolation between the HKMG structure 160 and the underlying active semiconductor layer 105. In some embodiments, the embedded insulation layer 108 comprises a silicon oxide layer that is formed by implanting oxygen ions in the upper region of the active semiconductor layer 105 (e.g., active silicon layer) to form an embedded oxygen implant layer, and then performing a thermal anneal process to convert the embedded oxygen implant layer into an embedded silicon dioxide layer.

As explained in further detail below, the embedded insulation layer 108 is formed subsequent to epitaxial growth of at least one epitaxial semiconductor nanosheet layer (e.g., sacrificial nanosheet layer) on an upper surface of the active semiconductor layer 105. This process allows, for example, a crystalline semiconductor layer (e.g., SiGe), which is used to form a nanosheet stack structure, to be epitaxially grown on top of the active semiconductor layer 105, followed by oxygen ion implantation and thermal annealing to form an oxide layer (e.g., silicon oxide (SiO) layer, a germanium oxide (GeO) layer, etc.). This process allows an epitaxial semiconductor layer for the nanosheet FET device to be epitaxially grown on the surface active semiconductor layer 105 prior to formation of the embedded insulation layer 105, which could not otherwise be epitaxially grown on top of an amorphous silicon oxide or germanium oxide layer.

Figure 2:
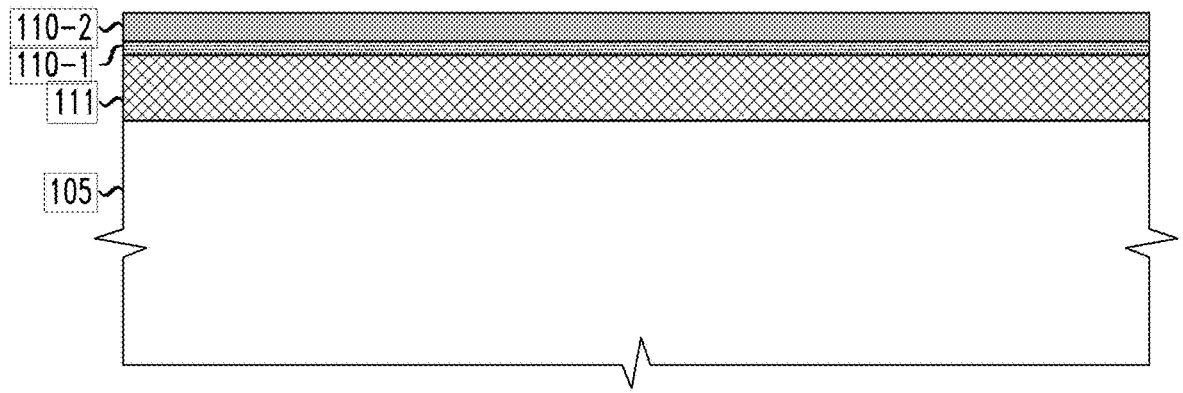

FIGS. 2-12B schematically illustrate a method for fabricating a semiconductor IC device comprising a nanosheet FET device and an embedded insulation layer for reduced leakage between the nanosheet FET device and an underlying semiconductor substrate, according to an embodiment of the invention. In particular, for illustrative purposes, FIGS. 2-12B schematically illustrate a method for fabricating the semiconductor IC device 10 as shown in FIGS. 1A and 1B. To begin, FIG. 2 is a schematic cross-sectional side view (Y-Z plane) of the semiconductor device 10 at an initial stage of fabrication comprising a semiconductor substrate 100 (e.g., wafer), and a sacrificial nanosheet layer 111 formed over the semiconductor substrate 100, and one or more screening layers 110-1 and 110-2 formed over the sacrificial nanosheet layer 111. While the semiconductor substrate 100 is illustrated as a generic substrate layer for ease of illustration, it is to be understood that the semiconductor substrate 100 may comprise one of different types of semiconductor substrate structures and materials.

For example, in one embodiment, the semiconductor substrate 100 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In other embodiments, the semiconductor substrate 100 may be an SOI (silicon-on-insulator) substrate, a GeOI (germanium-on-insulator) substrate, or other types of semiconductor-on-insulator substrates, which comprise an insulating layer (e.g., oxide layer) disposed between a base substrate layer (e.g., silicon substrate) and an active semiconductor layer (e.g., Si, Ge, etc.) in which active circuit components are formed as part of a front-end-of-line (FEOL) structure. In this regard, for ease of illustration, as noted above, the active semiconductor layer 105 represents an upper surface region of a bulk semiconductor substrate or the active semiconductor layer of a semiconductor-on-insulator substrate. It is to be noted that in each drawing, the X-Y plane represents a plane that is parallel to the plane of the semiconductor substrate 100 (e.g., wafer) being processed.

The sacrificial nanosheet layer 111 is formed over the surface of the active semiconductor layer 105. In some embodiments, the sacrificial nanosheet layer 111 comprises an epitaxial silicon-germanium (SiGe) semiconductor layer that is epitaxially grown on the surface of the active semiconductor layer 105. The sacrificial nanosheet layer 111 is part of a nanosheet layer stack 120 (e.g., FIG. 5) which is formed subsequent to the formation of the embedded insulation layer 108. As further shown in FIG. 1, a first screening layer 110-1 is formed on the surface of the sacrificial nanosheet layer 111, and a second screening layer 110-2 is formed on the surface of the first screening layer 110-1. The first and second screening layers 110-1 and 110-2 are utilized for the ion implantation process and serve various purposes.

For example, the first and second screening layers 110-1 and 110-2 serve to control the depth profile and dose of the implanted oxygen ions into the upper surface of the active semiconductor layer 105. Furthermore, the first and second screening layers 110-1 and 110-2 serve to protect the epitaxial material of the sacrificial nanosheet layer 111 from damage as a result of the oxygen ion implantation process. In particular, the first and second screening layers 110-1 and 110-2 serve to maintain good interface quality of the sacrificial nanosheet layer 111 to ensure the proper growth and quality of an epitaxial semiconductor layer (e.g., epitaxial silicon layer) on the surface of the sacrificial nanosheet layer 111, which serves as an active nanosheet channel layer of the nanosheet FET device. In addition, the first and second screening layers 110-1 and 110-2 serve to, e.g., prevent or mitigate out-diffusion of dopants during a thermal anneal which is performed subsequent to the oxygen ion implantation process, and to collect impurities which can be deposited on the surface of the sacrificial nanosheet layer 111 during the ion implantation process.

In some embodiments, the first screening layer 110-1 comprises a silicon oxide layer (e.g., silicon dioxide) which is deposited on the surface of the sacrificial nanosheet layer 111, and the second screening layer 110-2 comprises a silicon nitride (SiN) layer which is deposited on a surface of the first screening layer 110-1. In particular, in one exemplary embodiment, the first screening layer 110-1 comprises a thin silicon oxide layer that is deposited using, e.g., low pressure chemical vapor deposition (LPCVD), plasma enhanced atomic layer deposition (PEALD), etc., or other suitable deposition methods. In some embodiments, the first screening layer 110-1 is formed with a thickness in range of about 10 angstroms (Å) to about 50 Å. Further, in one exemplary embodiment, the second screening layer 110-2 comprises a thin silicon nitride layer that is deposited using, e.g., LPCVD, ALD, etc., or other suitable deposition methods. In some embodiments, the second screening layer 110-2 is formed with a thickness in range of about 10 Å to about 100 Å.

Figure 3:
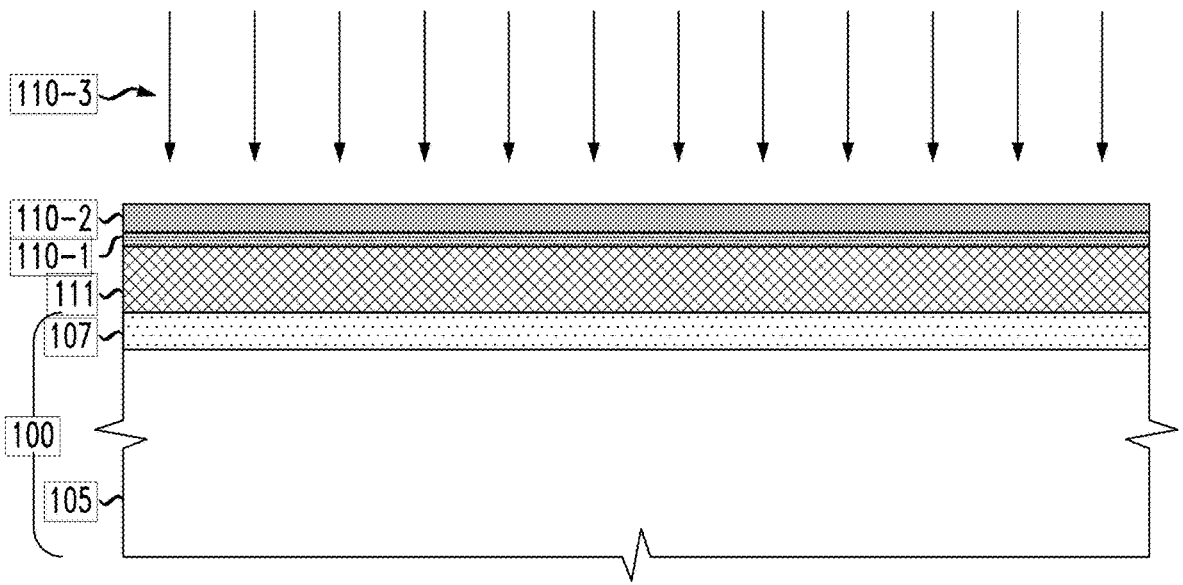
Figure 4:
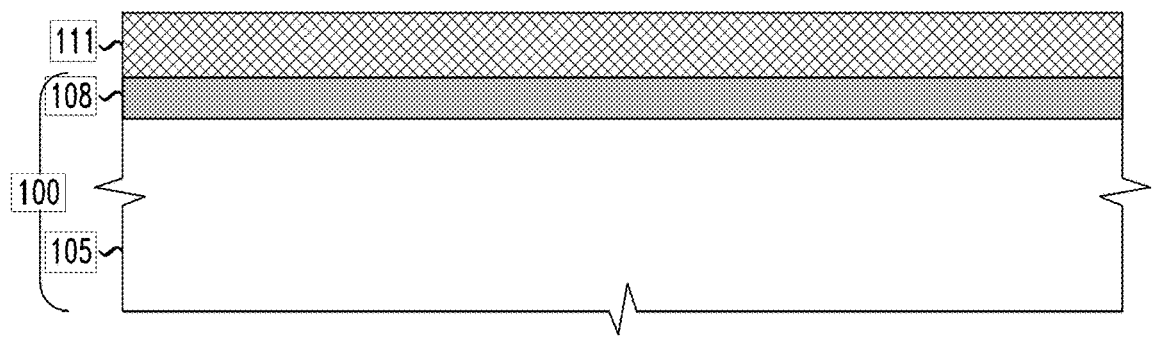

Following formation of the first and second screening layers 110-1 and 110-2, an oxygen ion implantation process and thermal anneal process are performed to form the embedded insulation layer 108, using a process flow as schematically illustrated in FIGS. 3 and 4. In particular, FIG. 3 is a schematic cross-sectional side view of the semiconductor IC device shown in FIG. 2 during an oxygen ion implantation process 110-3 that is performed to implant oxygen ions into the upper surface region of the active semiconductor layer 105 to form an oxygen ion implant region 107. Further, FIG. 4 is a schematic cross-sectional side view of the semiconductor IC device shown in FIG. 3 after performing a thermal anneal process to convert the oxygen ion implant region 107 into a silicon oxide layer (e.g., silicon dioxide) which forms the embedded insulation layer 108, and after removing the first and second screening layers 110-1 and 110-2. The physical, chemical, and electrical insulating properties of the embedded insulation layer 108 are dependent on ion implantation parameters such as accelerating voltage, oxygen ion dose, substrate temperature during the implant, and parameters of the post-implantation annealing treatment, etc.

While various ion implant parameters and conditions can be employed to form the oxygen ion implant region 107, in some exemplary embodiments, the ion implantation parameters are selected to achieve a target "projected range" of oxygen ion implantation into the upper surface of the active semiconductor layer 105 and a target oxygen ion concentration for the oxygen ion implant region 107. The term "projected range" denotes a target net distance of travel of the oxygen ions perpendicular to the substrate surface. In practice, not all oxygen ions come to rest at exactly the projected range, but that there will be a distribution of penetration depths. The broadness of such distribution of penetration depths is referred to as "projected straggle."

In the exemplary embodiment of FIG. 3, the oxygen ions are implanted at a sufficient energy to enable the oxygen ions to travel through the first and second screening layers 110-1 and 110-2 and the sacrificial nanosheet layer 111, and come to rest within the upper surface region of the active semiconductor layer 105 to thereby form the oxygen ion implant region 107 below the sacrificial nanosheet layer 111. The oxygen implantation process 110-3 may comprise a single oxygen ion implantation process that is performed at a given ion implantation energy, or multiple oxygen ion implantation processes that are performed at different ion implantation energies (for different projected ranges), depending on the desired thickness of the oxygen ion implant region 107. In addition, the oxygen implantation process 110-3 is performed with an oxygen ion dosage which is sufficient to form the oxygen ion implant region 107 with a desired oxygen ion concentration that is sufficient to form the embedded silicon oxide insulation layer 108 when subjected to a subsequent annealing step.

By way of example, in some embodiments, the oxygen ion implantation process 110-3 is performed with the following parameters: (i) an oxygen ion dosage in a range of about $1\times10^{16}/cm^2$ to about $1\times10^{19}/cm^2$; (ii) an oxygen ion beam current density of in a range of about 10 milliamps (mA)/cm$^2$ to about 150 mA/cm$^2$ (or a range of about 10 keV to about 300 keV); (iii) an ion implantation temperature in a range of about 20 degrees Celsius (° C.) to about 600° C. Further, in some embodiments, the oxygen ion implantation process 110-3 is performed so that the oxygen ion implant region 107 is formed with an oxygen ion concentration in a range of about $1\times10^{16}$ atoms/cm$^3$ to about $1\times10^{22}$ atoms/cm$^3$, and with a thickness in a range of about 5 nm to about 100 nm. It is to be understood that the above-noted parameter and conditions are exemplary and by no way limit the scope of the exemplary embodiments discussed herein.

After forming the oxygen ion implant region 107 within the upper surface region of the active semiconductor layer 105, the structure shown in FIG. 3 is then thermally annealed to convert the oxygen ion implant region 107 into a buried oxide layer which forms the embedded insulation layer 108. In some embodiments, the embedded insulation layer 108 formed by the thermal annealing process comprises a buried silicon dioxide layer having a thickness in a range of about 5 nm to about 100 nm. In some embodiments, the thermal annealing process is performed at a temperature in a range of about 800° C. to about 1400° C., and using a suitable gaseous ambient. The thermal annealing process may be performed for a period of time that ranges from about 30 minutes to about 600 minutes. The thermal anneal process may be performed at a single target temperature, or otherwise performed using a sequence of ramp and soak cycles at various ramp rates and soak times.

Following the thermal anneal process, the screening layers 110-1 and 110-2 are removed using wet or dry etch processes. For example, the second screening layer 110-2 (e.g., SiN layer) can be removed using a wet chemical etchant that etches the second screening layer 110-2 selective to the first screening layer 110-1. The first screening layer 110-1 (e.g., SiO layer) is then removed using, e.g., a wet etch process with a wet chemical etchant (e.g., HF) that etches the first screening layer 110-1 highly selective to the material (e.g., SiGe) of the underlying sacrificial nanosheet layer 111.

Figure 5:
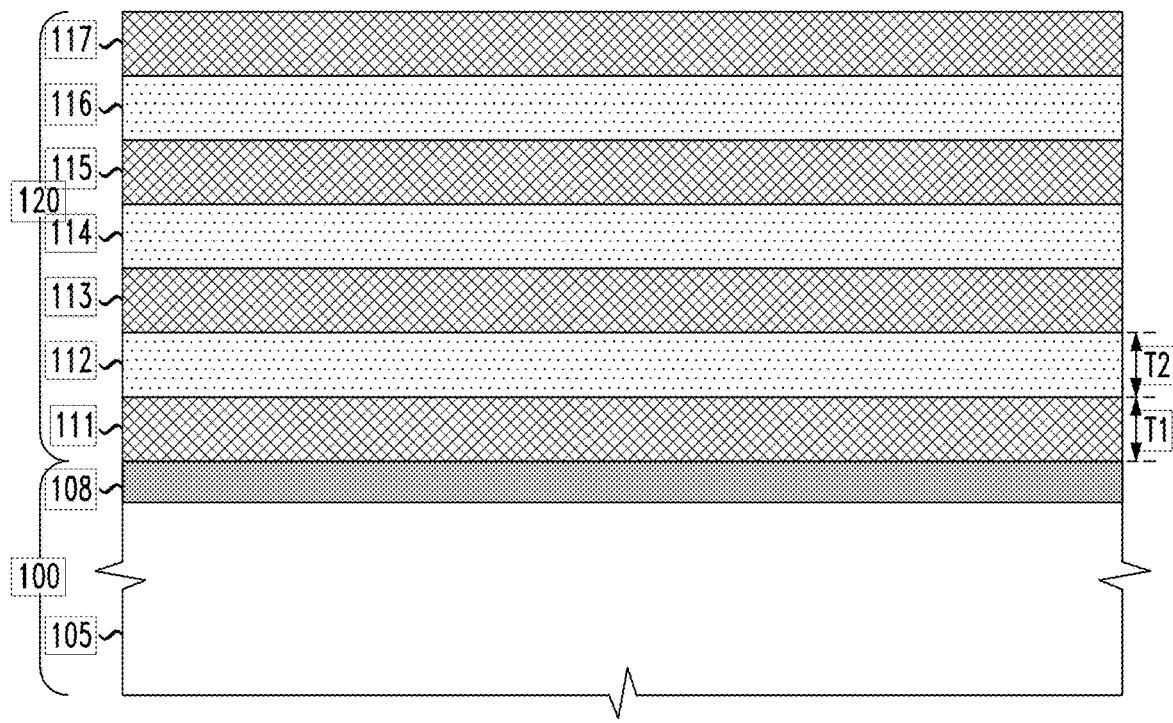

Next, FIG. 5 is a schematic cross-sectional side view of the semiconductor IC device shown in FIG. 4 after forming a nanosheet layer stack 120 over the embedded insulation layer 108. In the exemplary embodiment of FIG. 5, the nanosheet layer stack 120 comprises a stack of epitaxial semiconductor layers comprising sacrificial nanosheet layers 111, 113, 115, and 117, and active nanosheet channel layers 112, 114, and 116, wherein each active nanosheet channel layer 112, 114, and 116 is disposed between the sacrificial nanosheet layers in the nanosheet stack structure 120. The stack of alternating semiconductor layers 111-117 comprises epitaxial semiconductor layers that are sequentially grown. For example, as noted above, the sacrificial nanosheet layer 111 is epitaxially grown on the surface of the semiconductor substrate 100 prior to formation of the embedded insulation layer 108. In addition, the active nanosheet channel layer 112 is epitaxially grown on the sacrificial nanosheet layer 111, the sacrificial nanosheet layer 113 is epitaxially grown on the active nanosheet channel layer 112, the active nanosheet channel layer 114 is epitaxially grown on the sacrificial nanosheet layer 113, the sacrificial nanosheet layer 115 is epitaxially grown on the active nanosheet channel layer 114, the active nanosheet channel layer 116 is epitaxially grown on the sacrificial nanosheet layer 115, and the sacrificial nanosheet layer 117 is epitaxially grown on the active nanosheet channel layer 116.

In one embodiment, the epitaxial semiconductor layers 111-117 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The type of materials that are utilized to form the epitaxial semiconductor layers 111-117 will depend on various factors such as the type of nanosheet FET device (p-type, or n-type), and the desired level of etch selectivity between the semiconductor layers, as well as provide sufficient lattice matching between the materials of the semiconductor layers to ensure proper (e.g., defect-free) epitaxial growth of the crystalline semiconductor layers 111-117.

For example, in one embodiment, the active nanosheet channel layers 112, 114, and 116 are formed of epitaxial silicon (Si). When the active nanosheet channel layers 112, 114, and 116 are formed of crystalline Si, the sacrificial nanosheet layers 111, 113, 115, and 117 (which serve as sacrificial layers that are subsequently etched away to release the active nanosheet channel layers 112, 114, and 116), can be formed of an epitaxial silicon-germanium (SiGe) alloy. This allows the epitaxial SiGe material of the sacrificial nanosheet layers 111, 113, 115, and 117 to be etched selective to the epitaxial Si material of the semiconductor channel layers 112, 114, and 116 in a subsequent process step to "release" the active nanosheet channel layers 112, 114, and 116. In other embodiments, the active nanosheet channel layers 112, 114, and 116 can be formed of an epitaxial SiGe material with a desired Ge concentration (optimized for device performance), and the sacrificial nanosheet layers 111, 113, 115, and 117 can be formed of a sacrificial semiconductor material (e.g., Si) that can be etched selective to the active nanosheet channel layers 112, 114, and 116. While the nanosheet layer stack 120 is shown to include three active nanosheet channel layers 112, 114, and 116, in other embodiments of the invention, the nanosheet layer stack 120 can be fabricated with more or less than three active nanosheet channel layers.

As shown in FIG. 5, the sacrificial nanosheet layers 111, 113, 115, and 117 are formed with a thickness T1, and the active nanosheet channel layers 112, 114, and 116 are formed with a thickness T2. The thickness T1 of the sacrificial nanosheet layers 111, 113, 115, and 117 defines the spacing size (or channel spacing) above and below the active nanosheet channel layers 112, 114, and 116, in which high-k dielectric material and work function metal is formed. The spacing size (e.g., T1) and the type of WFM material(s) disposed in the spaces above and below the active nanosheet channel layers 112, 114, and 116 defines, in part, the threshold voltage (Vt) of the nanosheet FET device. In one embodiment, the thickness T1 of the sacrificial nanosheet layers 111, 113, 115, and 117 is in a range of about 8 nm to about 10 nm.

The thickness T2 of the semiconductor layers 112, 114, and 116 defines a thickness of the active nanosheet channel layers of the nanosheet FET device. The thickness T2 of the active nanosheet channel layers defines, in part, the threshold voltage (Vt) of the nanosheet FET device (e.g., Vt increases with decreasing channel thickness). In one embodiment, the thickness T2 of the active nanosheet channel layers 112, 114, and 116 is in a range of about 6 nm to about 9 nm, although the active nanosheet channel layers 112, 114, and 116 can be formed with other thickness ranges, depending on the application.

Figure 6B:
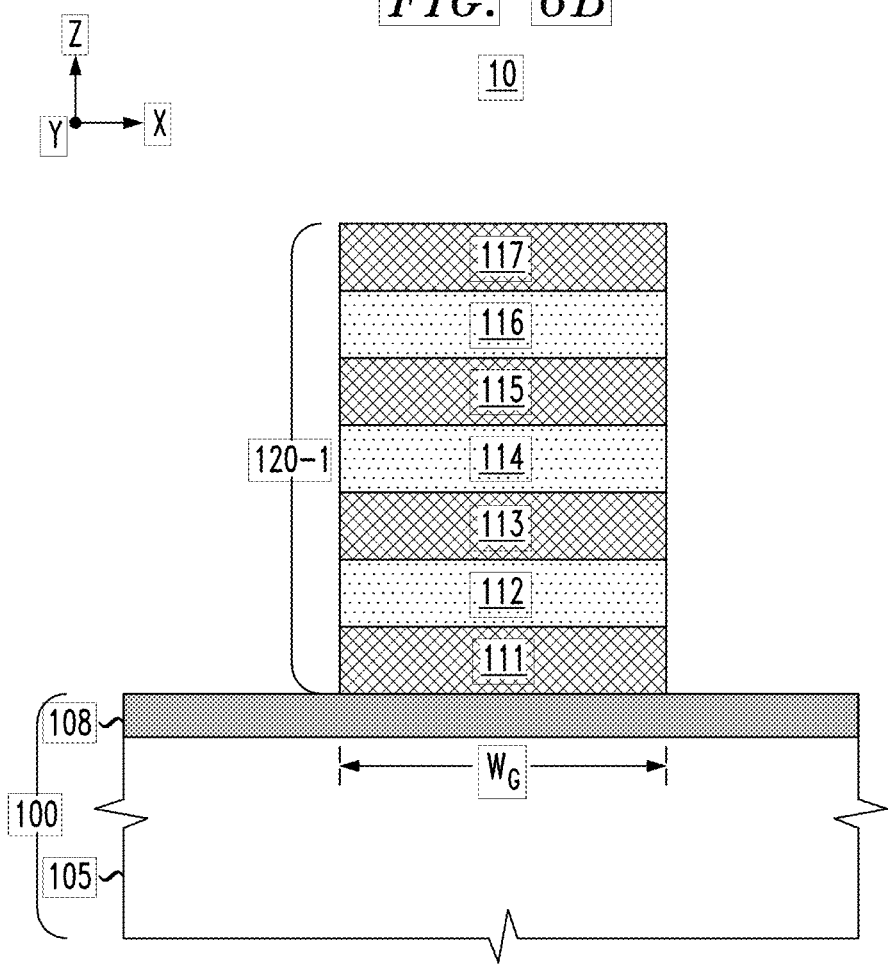
FIG. 6B is a schematic cross-sectional side view of the semiconductor IC device along line 6B-6B shown in FIG. 6A.

A next phase of the process flow comprises patterning the nanosheet layer stack 120 to define nanosheet stack structures for nanosheet FET devices that are formed in various regions of the semiconductor substrate 100. For example, FIGS. 6A and 6B are schematic views of the semiconductor IC device of FIG. 5 after patterning the nanosheet layer stack 120 to form an elongated nanosheet stack structure 120-1 (with a defined gate width $W_G$). In particular, FIG. 6A is a schematic top plan view (X-Y plane) of the resulting semiconductor structure, and FIG. 6B is a schematic cross-sectional side view (X-Z plane) of the resulting semiconductor structure along line 6B-6B shown in FIG. 6A. As shown in FIGS. 6A and 6B, the patterning process results in forming the elongated nanosheet stack structure 120-1 to defines the gate width $W_G$ of the active nanosheet channel layers 112, 114, and 116 of the nanosheet FET device. In one embodiment, the gate width $W_G$ is larger (e.g., 2X or more) than the thickness T2 of the active nanosheet channel layers 112, 114, and 116.

In one embodiment, the patterning process is performed by forming an etch mask (e.g., a lithographic mask) on the nanosheet layer stack 120, wherein the etch mask comprises an image of the elongated nanosheet stack structure 120-1 to be transferred into the nanosheet layer stack 120 using dry etch process (e.g., reactive ion etching (RIE)). The etch mask can be formed using any suitable patterning process including, but not limited to, a photolithography process, or a multi-patterning process such as a sidewall image transfer (SIT) process, a self-aligned double patterning (SADP) process, a self-aligned quadruple patterning (SAQP), etc. The etching can be performed using one or more sequential dry etch processes with etch chemistries that are suitable to etch the materials of semiconductor layers 111-117 of the nanosheet layer stack 120 down to the embedded insulation layer 108.

Next, FIGS. 7A, 7B, and 7C are schematic views of the semiconductor IC device shown in FIGS. 6A and 6B after forming a dummy gate structure which overlaps a portion of the elongated nanosheet stack structure 120-1, and then patterning exposed portions of the elongated nanosheet stack structure 120-1 in source/drain regions adjacent to the dummy gate structure to form a nanosheet stack structure 120-2 with a defined length L. In particular, FIG. 7A is a schematic top plan view (X-Y plane) of the resulting semiconductor structure, FIG. 7B is a schematic cross-sectional side view (Y-Z plane) of the resulting semiconductor structure along line 7B-7B shown in FIG. 7A, and FIG. 7C is a schematic cross-sectional side view (X-Z plane) of the resulting semiconductor structure along line 7C-7C shown in FIG. 7A. As shown in FIGS. 7A, 7B, and 7C, the gate structure includes a dummy gate oxide layer 130 and a dummy gate electrode layer 132 (e.g., sacrificial polysilicon or amorphous silicon material). In addition, the gate structure includes a gate capping layer 134 and a gate sidewall spacer 136. The dummy gate oxide layer 130 and the dummy gate electrode layer 132 comprise sacrificial gate material which is subsequently removed as part of a replacement metal gate (RMG) process and replaced with a high-k gate dielectric material and metallic material to form a HKMG gate structure for the nanosheet FET device.

The semiconductor device structure shown in FIGS. 7A, 7B, and 7C is fabricated using known methods. For example, a thin conformal layer of silicon oxide is deposited over the entire surface of the semiconductor IC device shown in FIGS. 6A and 6B, and a layer of polysilicon (or alternatively, amorphous silicon) is blanket deposited over the conformal layer of silicon oxide, and then planarized using known techniques. A hard mask layer is formed on the planarized surface of the polysilicon layer by depositing a layer of dielectric material or multiple layers of dielectric materials (e.g., SiN, SiOCN, SiBCN). The hard mask layer is then patterned to form the gate capping layer 134, which defines an image of the gate structure. The gate capping layer 134 is then utilized as an etch hardmask to anisotropically etch (e.g., RIE) the sacrificial polysilicon and oxide layers to thereby form the dummy gate layers 130 and 132.

The gate sidewall spacer 136 is then formed by depositing a conformal layer of dielectric material over the entire surface of the semiconductor IC device. The conformal layer of dielectric material can be formed of SiN, SiBCN, SiCON, or any other type of low-k dielectric material that is commonly used to form insulating gate sidewall spacers of FET devices, and deposited using known techniques such as ALD, CVD and PVD. The conformal layer of dielectric material is then patterned by performing an anisotropic dry etch process, such as RIE, to etch down the conformal layer of dielectric material in a vertical direction. This etch process is performed selective to the semiconductor materials of the elongated nanosheet stack structure 120-1 and the embedded insulation layer 108. The etch process results in the formation of the gate sidewall spacer 136, which surrounds the dummy gate layers 130 and 132 and the gate capping layer 134, as shown in FIGS. 7A-7C. The gate sidewall spacer 136 defines a gate region of the nanosheet FET device.

After forming the gate sidewall spacer 136, an anisotropic dry etch process (e.g., RIE) is performed to etch the exposed portions of the elongated nanosheet stack structure 120-1 in the source/drain regions adjacent to the gate structure down to the upper surface of the embedded insulation layer 108. This etch process results in forming the individual nanosheet stack structure 120-2 of the nanosheet FET device wherein the individual nanosheet stack structure 120-2 has a defined length L in the X-direction (see FIGS. 7A and 7B). The gate width $W_G$ in the X-direction (see FIGS. 7A and 7C) of the resulting nanosheet stack structure 120-2 is maintained since the sidewall surfaces of the nanosheet stack structure 120-2 which define the gate width $W_G$ are covered by the dummy gate layers 130 and 132, and the gate sidewall spacers 136 (see, e.g., FIG. 7C). It is to be understood that FIGS. 7A-7C illustrate an exemplary embodiment in which the gate structure overlaps one nanosheet stack structure 120-2. In practice, the gate structure shown in FIG. 7A, for example, would be an elongated gate structure that extends in the X direction to overlap a plurality of nanosheet stack structures of other nanosheet FET devices.

Next, FIG. 8 is a schematic cross-sectional side view of the semiconductor IC device shown in FIG. 7B after laterally recessing exposed sidewall surfaces of the sacrificial nanosheet layers 111, 113, 115, and 117 of the nanosheet stack structure 120-2 to form recesses 120-R in the sidewalls of the nanosheet stack structure 120-2. As shown in FIG. 8, the exposed sidewall surfaces of the sacrificial nanosheet layers 111, 113, 115, and 117 are recessed to a recess depth R (in the Y-direction). The depth of the lateral recess R is controlled through a timed etch. In one embodiment, the recess depth R is performed to recess the sacrificial nanosheet layers 111, 113, 115, and 117 to a depth which is equal to a lateral thickness of the gate sidewall spacer 136. In this exemplary embodiment, the recessed sacrificial nanosheet layers 111, 113, 115, and 117 still overlap portions of the active nanosheet channel layers 112, 114, and 116 which define the gate length $L_G$ of the nanosheet FET device.

In one embodiment of the invention, the lateral etch process can be performed using an isotropic wet etch process with an etch solution that is suitable to etch the semiconductor material (e.g., SiGe) of the sacrificial nanosheet layers 111, 113, 115, and 117 of the nanosheet stack structure 120-2 selective to the semiconductor material (e.g., Si) of the active nanosheet channel layers 112, 114, and 116, and other exposed elements. In another embodiment, an isotropic dry plasma etch process can be performed to laterally etch the exposed sidewall surfaces of the sacrificial nanosheet layers 111, 113, 115, and 117 selective to the active nanosheet channel layers 112, 114, and 116, and other exposed elements.

Next, FIG. 9 is a schematic cross-sectional side view of the semiconductor IC device shown in FIG. 8 after forming the embedded gate sidewall spacers 138 within the recessed regions 120-R. In one embodiment, the embedded gate sidewall spacers 138 are formed of the same dielectric material used to form the gate sidewall spacer 136. For example, the embedded gate sidewall spacers 138 can be formed of SiN, SiBCN, SiCO, SiBCN, SiCON, or any other type of dielectric material (e.g., a low-k dielectric material having a k of less than 5, wherein k is the relative dielectric constant) which is used to form the insulating gate sidewall spacer 136 of the nanosheet FET device.

In one embodiment, the embedded gate sidewall spacers 138 are formed by depositing a conformal layer of dielectric material over the semiconductor IC device of FIG. 8 until the recesses 120-R are filled with dielectric material, followed by an etch back to remove the excess dielectric material from the gate structure and the substrate 100. The dielectric material is deposited using a highly conformal deposition process, such as ALD, to ensure that the recesses 120-R are sufficiently filled with dielectric material. The conformal layer of dielectric material can be etched back using an isotropic (wet or dry) etch process to remove the excess dielectric material, while leaving the dielectric material in the recesses 120-R to form the embedded gate insulating spacers 138. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HFEG), hydrochloric acid (HCl), or any combination thereof.

Figure 10:
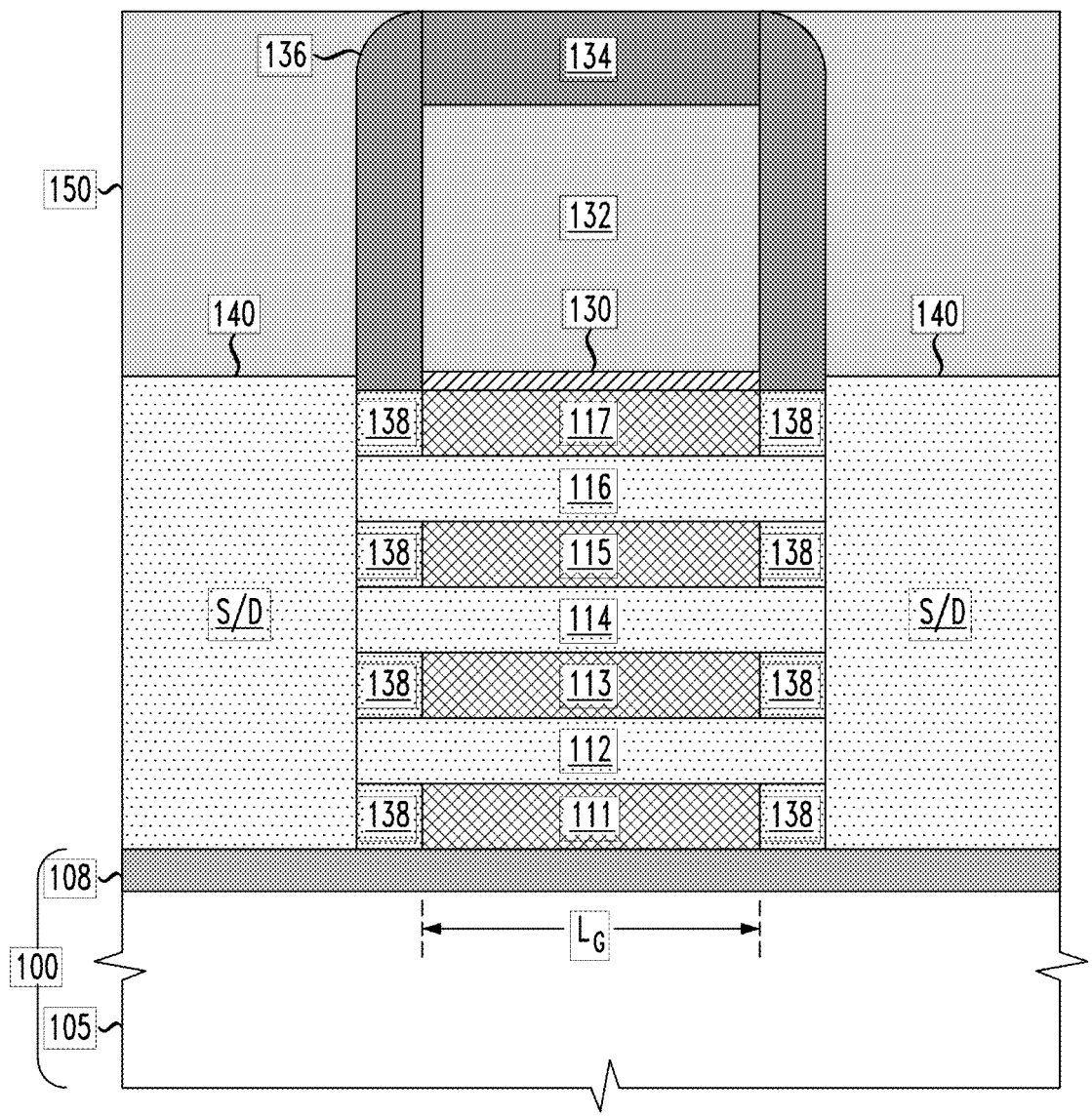

Next, FIG. 10 is a schematic cross-sectional side view of the semiconductor IC device shown in FIG. 9 after forming source/drain layers 140 of the nanosheet FET device and forming an insulating layer 150 (e.g., ILD or PMD layer) to cover the nanosheet FET device. The source/drain layers 140 are formed by epitaxially growing semiconductor material (e.g., epitaxial Si material, SiGe material, carbon-doped silicon (Si:C) material) on the exposed sidewall surfaces of the active nanosheet channel layers 112, 114, and 116 using known techniques such as CVD, MOCVD, LPCVD, MBE, VPE, or other known epitaxial growth techniques which are suitable for the given process flow. In this exemplary embodiment, the exposed sidewall surfaces of the active nanosheet channel layers 112, 114, and 116 provide a surface area to seed the epitaxial growth of the S/D layers 140. The type of epitaxial semiconductor material that is used to form the S/D layers 140 will vary depending on, e.g., the device type (e.g., n-type or p-type) of the nanosheet FET device, etc.

In some embodiments, the epitaxial growth of the semiconductor material is performed so that the epitaxial material merges (in the Z-direction) to form the source/drain layers 140. Furthermore, in some embodiments, the source/drain regions 140 are doped using known techniques. For example, in one embodiment, the source/drain layers 140 are "in-situ" doped during epitaxial growth by adding a dopant gas to the source deposition gas (i.e., the Si-containing gas). Exemplary dopant gases may include a boron (B) containing gas such as $BH_3$ for p-type FETs or a phosphorus (P) or arsenic (As) containing gas such as $PH_3$ or $AsH_3$ for n-type FETs, wherein the concentration of impurity in the gas phase determines its concentration in the epitaxially grown semiconductor material.

The use of an in-situ doping process is merely an example. For instance, an ex-situ process may be used to introduce dopants into the source/drain layers. Other doping techniques can be used to incorporate dopants in the source/drain layers. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. As shown in FIG. 10, the embedded insulation layer 108 provides insulation between the source/drain layers 140 and the substrate 100.

In addition, in some embodiments, a thermal anneal process is performed following the epitaxial growth and doping of the source/drain layers 140 to cause dopants to be injected into the end portions of the active nanosheet channel layers 112, 114, and 116 that are in contact with the epitaxial semiconductor material of the source/drain layers 140. This anneal process effectively results in extending the source/drain layers 140 into the semiconductor material of the end portions of the active nanosheet channel layers 112, 114, and 116, which results in a decrease in the parasitic resistance of the nanosheet FET device. In other embodiments, the thermal anneal process is performed in later process (such as after the formation of the high-k gate dielectric layers) so that the same anneal process can serve two purposes at the same time: driving dopants into the nanosheet layers, and improve the reliability of the high-k gate dielectric.

Following the formation of the epitaxial source/drain layers 140, the process flow continues with forming the insulating layer 150 (e.g., ILD layer, or PMD layer) to encapsulate the gate structure and source/drain layers 140 in dielectric/insulating material, prior to commencing a replacement metal gate process. In one embodiment, the insulating layer 150 is formed by depositing a blanket layer of dielectric/insulating material over the semiconductor IC device and planarizing the layer of dielectric/insulating material down to the gate capping layer 134 to form the insulating layer 150, as shown schematically shown in FIG. 10.

The insulating layer 150 may comprise any suitable insulating/dielectric material that is commonly utilized in semiconductor process technologies including, but not limited to, silicon oxide, silicon nitride, silicon oxynitride, SiCOH, SiCH, SiCNH, or other types of silicon-based low-k dielectrics (e.g., k less than about 4.0), porous dielectrics, known ULK (ultra-low-k) dielectric materials (with k less than about 2.5), or any suitable combination of those materials. The dielectric/insulating material for the insulating layer 150 is deposited using known deposition techniques, such as, for example, ALD, CVD, PECVD, PVD, or spin-on deposition. In one embodiment, the layer of dielectric/insulating material is planarized using a standard planarization process such as CMP to remove the overburden dielectric/insulating down to the upper surface of the dummy gate capping layer 134. In some embodiments, the insulating layer 150 comprises a conformal silicon nitride liner that is initially formed on the exposed surfaces of dummy gate structure and source/drain layers 140, before blanket depositing one or more insulating materials to form the insulating layer 150.

Figure 11B:
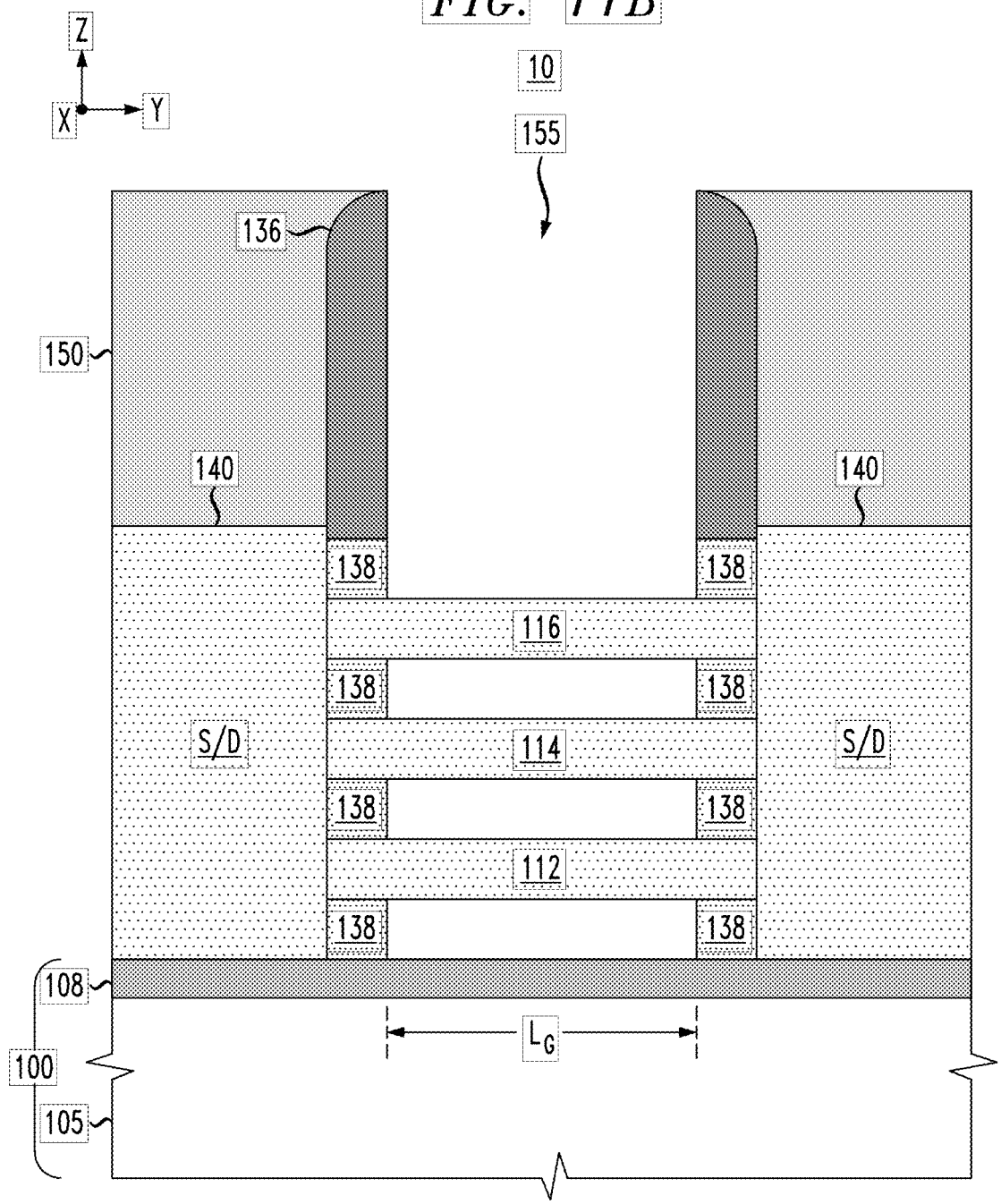
FIG. 11B is a schematic cross-sectional side view of the semiconductor IC device along line 11B-11B shown in FIG. 11A.

Following the formation of the insulating layer 150, a replacement metal gate process is performed to replace the sacrificial gate dummy gate materials with a HKMG structure, using a process flow as schematically illustrated in FIGS. 11A through 12B. For example, FIGS. 11A, 11B, and 11C are schematic views of the semiconductor IC device shown in FIG. 10 after removing the dummy gate capping layer 134 and the dummy gate sacrificial layers (e.g., the dummy gate oxide layer 130 and the dummy gate electrode layer 132), and after removing the sacrificial nanosheet layers 111, 113, 115, and 117 to release the active nanosheet channel layers 112, 114 and 116 and form an open gate region 155. FIG. 11A is schematic top plan view (X-Y plan view) of the resulting semiconductor structure, FIG. 11B is a schematic cross-sectional side view (Y-Z plane) of the resulting semiconductor structure along line 11B-11B shown in FIG. 11A, and FIG. 11C is a schematic cross-sectional side view (X-Z plane) of the resulting semiconductor structure along line 11C-11C shown in FIG. 11A.

In one embodiment, the dummy gate capping layer 134 can be removed by planarizing (e.g., via CMP) the surface of the semiconductor IC device shown in FIG. 10 down to the upper surface of the dummy gate electrode layer 132. In another embodiment, the dielectric material of the dummy gate capping layer 134 (e.g., SiN) can be etched away selective to the materials of the gate sidewall spacer 136 (e.g., SiBCN) and the insulating layer 150 (e.g., silicon oxide) to expose the underlying dummy gate electrode layer 132. The dummy gate electrode layer 132 (e.g., sacrificial polysilicon layer, or amorphous silicon layer) and dummy gate oxide layer 130 are then etched away using known etching techniques and etch chemistries.

For example, the sacrificial dummy gate polysilicon material can be removed using a selective dry etch or wet etch process with suitable etch chemistries, including ammonium hydroxide (NH$_4$OH), tetramethylammonium hydroxide (TMAH), or SF6 plasma. The etching of the dummy poly gate layer is selective to, e.g., dummy gate oxide layer, to thereby protect the active nanosheet channel layers 112, 114, and 116 from being etched during the poly etch process. After the polysilicon material is removed, an oxide etch process is performed to etch away the dummy gate oxide layer 130 selective to, e.g., the active nanosheet channel layers 112, 114, and 116. In this manner, the sacrificial materials (e.g., dummy polysilicon and oxide layers) of the dummy gate layer 130 can be etched away without damaging the active nanosheet channel layers 112, 114, and 116.

After removing the dummy gate layers 132 and 130, an etch process is performed to selectively etch away the sacrificial nanosheet layers 111, 113, 115, and 117 of the nanosheet stack structure 120-2 and thereby release the active nanosheet channel layers 112, 114, and 116 and extend the open gate regions 155 into spaces between and adjacent to the active nanosheet channel layers 112, 114, and 116. The sacrificial nanosheet layers 111, 113, 115, and 117 (e.g., SiGe layers) are etched selective to the active nanosheet channel layers 112, 114, and 116 (e.g., Si layers). In one embodiment, the SiGe material of the sacrificial nanosheet layers 111, 113, 115, and 117 can be selectively etched (with high etch selectivity) using a gas phase HCl (hydrochloric acid) or wet etch solution containing hydrogen peroxide (H$_2$O$_2$) to etch the SiGe material of the sacrificial nanosheet layers 111, 113, 115, and 117 selective to the Si material of the active nanosheet channel layers 112, 114, and 116. The gas phase HCl (hydrochloric acid) provides high etch selectivity when, for example, the active nanosheet channel layers 112, 114, and 116 are formed of Si or SiGe with a lower Ge concentration than the SiGe material of the sacrificial nanosheet layers 111, 113, 115, and 117.

Figure 12A:
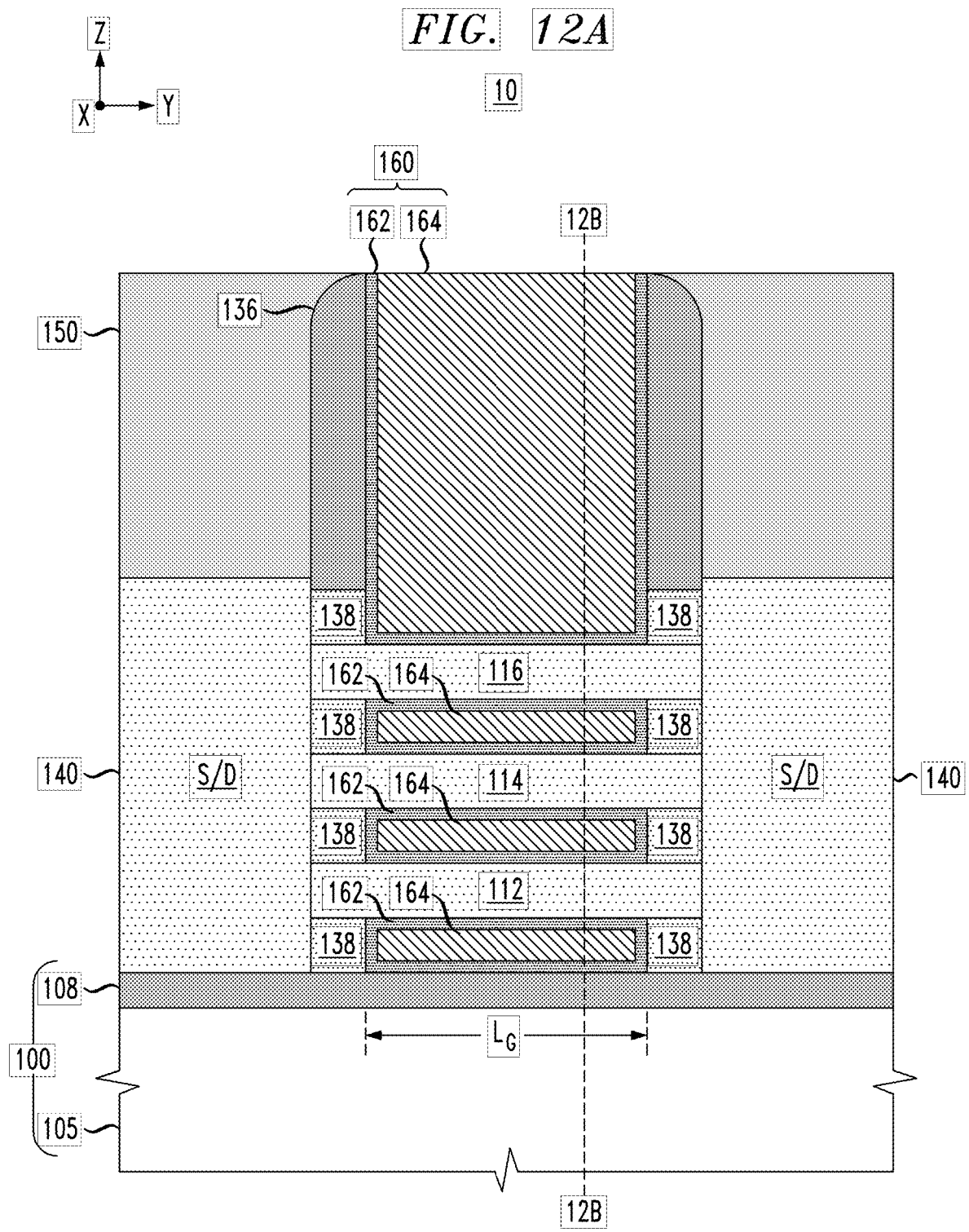
FIG. 12A is a schematic cross-sectional side view of the semiconductor IC device shown in FIG. 11B after forming a high-k dielectric/metal gate structure around the active nanosheet channel layers.
Figure 12B:
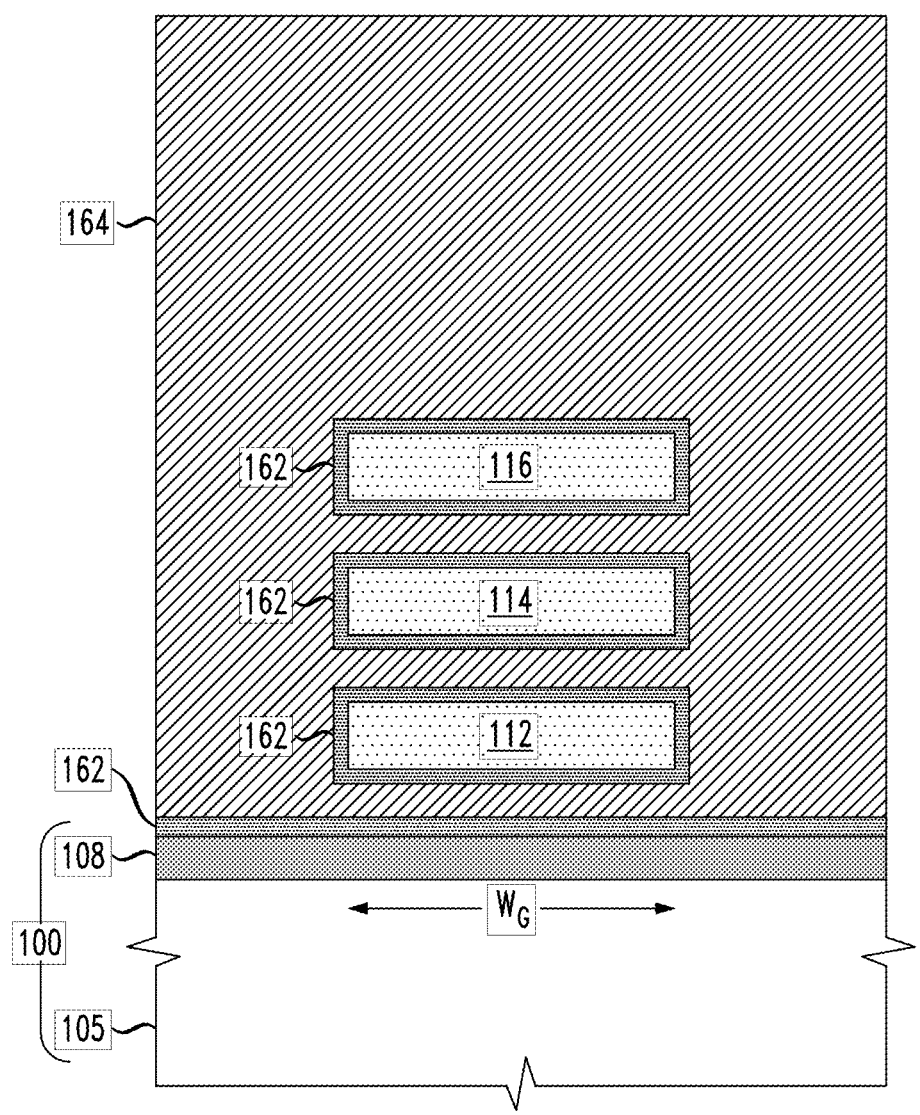

Next, FIGS. 12A and 12B are schematic cross-sectional side views of the semiconductor IC device shown in FIGS. 11B and 11C, respectively, after forming the HKMG structure 160. FIG. 12B is a schematic cross-sectional side view (X-Z plane) of the resulting semiconductor structure along line 12B-12B shown in FIG. 12A. The HKMG structure 160 comprises a high-k gate dielectric layer 162 and a metal gate layer 164. In one embodiment, the HKMG structure 160 is formed by depositing one or more conformal layers of high-k gate dielectric material over the exposed surfaces of the semiconductor structure to conformally cover the surfaces of the active nanosheet channel layers 112, 114, and 116. The high-k gate dielectric layer 162 is preferably formed of a high-k dielectric material having a dielectric constant of about 3.9 or greater.

For example, the gate dielectric material can include but is not limited to metal oxides such as hafnium oxide, hafnium silicon oxide, hafnium silicon oxynitride, hafnium zirconium oxide, and nitride films thereof. In other embodiments, the high-k dielectric may comprise lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. In one embodiment of the invention, the conformal high-k gate dielectric layer 162 is formed with a thickness in a range of about 0.5 nm to about 2.0 nm, which will vary depending on the target application. The conformal layer of high-k gate dielectric material is deposited using known methods such as ALD, for example, which allows for high conformality of the gate dielectric material.

As is known in the art, the use of high-k gate dielectric materials can be problematic in that such dielectric materials typically do not interface well with silicon layers. For example, high-k gate dielectric materials do not passivate a silicon surface, which results in a large number of interface traps and charges and other issues which can degrade device performance. As such, in one exemplary embodiment, before depositing the high-k dielectric material to form the high-k gate dielectric layer 162, a channel pre-clean process is performed to clean the exposed silicon surfaces of the active nanosheet channel layers 112, 114, and 116, which is then followed by an oxidation process to grow ultra-thin interfacial silicon oxide layers on the exposed surfaces of the active nanosheet channel layers 112, 114, and 116. It is to be understood that the formation of the interfacial silicon oxide layers is an optional step and that in other embodiments of the invention, a high-k dielectric material of the HKMG structures can be formed on the exposed silicon surfaces of the active nanosheet channel layers without initially forming the thin interfacial oxide layers.

In one exemplary embodiment, the interfacial silicon oxide layers are formed using a chemical oxidation process in an ozonated deionized water comprising ozone, and a suitable oxidation temperature, ozone concentration in the deionized water, and chemical oxidation process time to form thin interfacial silicon oxide layers. The interfacial layers are formed by oxidizing the exposed silicon surfaces of the active nanosheet channel layers 112, 114, and 116 to form thin interfacial silicon oxide layers with a thickness in a range of about 5 angstroms to about 10 angstroms (i.e., about 0.5 nm to about 1 nm).

In some embodiments, the metal gate layer 164 comprises one or more work function metal layers which are conformally deposited over the high-k gate dielectric layer 162. The work function metal layer(s) may comprise one or more types of metallic materials, including, but not limited to, titanium nitride (TiN), tantalum nitride (TaN), and an Al-containing alloy (e.g., TiAlC, TiAl, and AlC, or nitrided alloys thereof). In other embodiments, the work function metal layer(s) may comprise a metallic material which comprises a composition or alloy of Zr, W, Hf, Ti, Al, Ru, Pa, ZrAl, WAl, TaAl, HfAl, TaC, TiC, TaMgC, and other types, compositions, or alloys of work function metals that are commonly used to obtain target work functions which are suitable for the type (e.g., N-type or P-type) of nanosheet FET devices that are to be formed. The work function metal layers are conformally deposited using known methods such as ALD, CVD, etc., which allow for high conformality of the deposited work function metal layers.

In some embodiments, the work function metal layers completely fill the spaces above and below the active nanosheet channel layers 112, 114, and 116. Indeed, in instances where the initial spacing between the active nanosheet channels 112, 114 and 116 is relatively small (e.g., 7 nm to 10 nm), after formation of the high-k dielectric layer 162, the conformal deposition of a stack of two or more work function metal layers can result in filling (i.e., pinch-off) the spaces above and below the active nanosheet channel layers 112, 114, and 116 such that the spaces are filled with gate dielectric material and work function metal. This is sufficient for short-channel length nanosheet FET devices where $L_G$ is about 15 nm or less.

Furthermore, in some embodiments, the remaining portions of the open gate region 155 above the active nanosheet channel layers 116 can be filled with work function metal by continuing the deposition process for the last deposited work function metal layer until the open gate region 155 above the active nanosheet channel layer 116 is completely filled with the work function metal layer. In other embodiments, the remaining portion of the open gate region 155 can be filled with a low-resistance metallic material such as tungsten, ruthenium, cobalt, copper, aluminum, etc. to form a metallic gate electrode apart from the work function metal.

Following the deposition of the dielectric and metallic materials that form the HKMG structure 160, a CMP process is performed to polish the surface of the semiconductor structure down to the ILD layer 150, thereby removing overburden portions of the gate dielectric, work function, and gate electrode layers, resulting in the semiconductor structure shown in FIGS. 12A and 12B. Following formation of HKMG structure 160, any known sequence of processing steps can be performed to complete the fabrication of the semiconductor integrated circuit device, the details of which are not needed to understand embodiments of the invention.

Briefly, following the formation of the HKMG structure 160, an etch process can be performed to recess an upper surface of the HKMG structure 160 down to a target level below the upper surface of the insulating layer 150. A layer of dielectric material is then deposited over the surface of the semiconductor device structure to fill the area above the recessed surfaces of the HKMG structure 160 with dielectric material, and the semiconductor device structure is planarized down to the surface of the insulating layer 150 to remove the overburden dielectric material, and thereby form the gate capping layer 170 (as shown in FIGS. 1A and 1B). The gate capping layer 170 can be formed of a dielectric material such as SiN or SiBCN, etc. Next, middle-of-the-line (MOL) processing can continue to form MOL contacts such as the source/drain contacts 180 (as shown in FIG. 1A) and gate contacts, etc., using known materials and fabrication techniques. Then, a back-end-of-line (BEOL) process module can be performed to fabricate a BEOL interconnect structure which provides connections to/between the MOL contacts, and other active or passive devices that are formed as part of the front-end-of-line (FEOL) layer.

In some embodiments, the vertical source/drain contacts 180 shown in FIG. 1A comprise trench silicide (TS) contacts which are formed using known methods. For example, the TS contacts 180 are formed by a process which comprises etching a contact opening in the insulating layer 150 to expose the source/drain layers 140, forming stack of layers in the contact openings over the source/drain layers 140, wherein the stack of layers comprises an epitaxial contact layer formed on each of the source/drain layers 150, a metallic contact liner layer formed on the epitaxial contact layer, and a metallic fill layer formed over the metallic contact liner layer. A thermal anneal process is then performed to induce a reaction between the epitaxial contact layers and the metallic contact liners layer to form silicide contact layers on the source/drain layers 140, thereby forming the vertical TS source/drain contacts 180.

It is to be appreciated that the exemplary embodiments described herein provide methods to achieve electrical isolation between nanosheet FET devices and an underlying semiconductor substrate and effectively eliminate FET device leakage issues. In some conventional isolation methods, the bottom sacrificial nanosheet layer (which is grown on the surface of the semiconductor substrate) is formed of SiGe with a concentration of Ge that is higher than the Ge concentration of other SiGe sacrificial nanosheet layers in the nanosheet stack. This allows the bottom sacrificial nanosheet layer to be etched away selective to other sacrificial nanosheet layers of the nanosheet stack at an initial stage of the RMG process. To achieve isolation, a thin layer of SiN is conformally deposited within the gate region to replace the removed bottom sacrificial nanosheet layer, wherein the SiN layer serves to provide isolation between the subsequently formed HKMG structure and the underlying substrate. However, the formation of the SiN isolation layer is problematic for various reasons.

For example, it is difficult to completely remove the bottom sacrificial nanosheet layer before forming the SiN layer. In this regard, some residual portion of the bottom sacrificial SiGe layer may remain, which can least to gate-to-substrate leakage. In addition, the formation of the thin conformal SiN isolation layer (via ALD, for example) is problematic because the gate openings are very narrow, which can lead to insufficient formation of the SiN isolation layer (e.g., voids formed in the SiN layer) and variable thickness in the SiN isolation layers for FET devices with different channel lengths, leading to possible device leakage issue and variable FET device characteristics. Furthermore, the high Ge concentration of the bottom sacrificial nanosheet layer can degrade the quality of the epitaxial material (epitaxial Si) of the first active nanosheet channel layer that is grown on the bottom scarification nanosheet layer.

In contrast, the isolation methods described herein eliminate such problems as the formation of the thin embedded oxide layer formed in the active semiconductor layer below the nanosheet FET device can be tightly controlled through the ion implantation process, and thereby eliminates gate and S/D leakage issues. The use of the embedded oxide layer serves to reduce device-to-device variation since the ion implantation process is global and results in the formation of an embedded oxide layer that provide sufficient isolation for nanosheet FET devices irrespective of channel length.

It is to be understood that the exemplary methods discussed herein for fabricating gate-all-around FET devices such as nanosheet FET devices with embedded insulations for reduced leakage can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor device, comprising:
    forming a first epitaxial semiconductor layer on a surface of a semiconductor substrate;
    forming a screening layer over the first epitaxial semiconductor layer;
    performing an ion implantation process to form an embedded insulation layer within the semiconductor substrate below the first epitaxial semiconductor layer;
    forming a nanosheet field-effect transistor device over the embedded insulation layer, wherein the nanosheet field-effect transistor device comprises a plurality of active nanosheet channel layers, source/drain layers in contact with end portions of the active nanosheet channel layers, and a high-k dielectric/metal gate structure formed around the active nanosheet channel layers;
    wherein forming the nanosheet field-effect transistor device comprises removing the first epitaxial semiconductor layer to release the active nanosheet channel layers;
    wherein the embedded insulation layer isolates the high-k dielectric/metal gate structure and the source/drain layers from the semiconductor substrate;
    wherein the screening layer is formed over the first epitaxial semiconductor layer, prior to performing the oxygen ion implantation process; and
    wherein performing the ion implantation process to form the embedded insulation layer within the semiconductor substrate below the first epitaxial semiconductor layer comprises:
        performing an oxygen ion implantation process to form an oxygen ion implant region within an upper surface region of the semiconductor substrate below the first epitaxial semiconductor layer; and
        performing a thermal anneal process to convert the oxygen ion implant region to an embedded oxide layer.

2. The method of claim 1, wherein parameters of the oxygen ion implantation process are configured to form the oxygen ion implant region having an oxygen ion concentration of about $1 \times 10^{16}$ atoms/cm$^3$ to about $1 \times 10^{22}$ atoms/cm$^3$.

3. The method of claim 1, wherein the semiconductor substrate comprises a silicon substrate and wherein the embedded oxide layer comprises a silicon oxide layer.

4. The method of claim 1, wherein the embedded oxide layer has a thickness in a range of about 5 nm to about 100 nm.

5. The method of claim 1, wherein the screening layer comprises a screening oxide layer formed over the first epitaxial semiconductor layer.

6. The method of claim 5, wherein the screening layer further comprises a screening nitride layer formed over the screening oxide layer.

7. A method for fabricating a semiconductor device, comprising:
    forming a first epitaxial semiconductor layer on a surface of a semiconductor substrate;
    performing an ion implantation process to form an embedded insulation layer within the semiconductor substrate below the first epitaxial semiconductor layer;
    forming a nanosheet field-effect transistor device over the embedded insulation layer, wherein the nanosheet field-effect transistor device comprises a plurality of active nanosheet channel layers, source/drain layers in contact with end portions of the active nanosheet channel layers, and a high-k dielectric/metal gate structure formed around the active nanosheet channel layers;

wherein the embedded insulation layer isolates the high-k dielectric/metal gate structure and the source/drain layers from the semiconductor substrate; and wherein forming the nanosheet field-effect transistor device over the embedded insulation layer comprises:

forming a nanosheet layer stack over the embedded insulation layer, wherein the nanosheet layer stack comprises a plurality of epitaxial semiconductor layers comprising sacrificial nanosheet layers and the active nanosheet channel layers, wherein the first epitaxial semiconductor layer comprises a sacrificial nanosheet layer of the nanosheet layer stack;

patterning the nanosheet layer stack down to the embedded insulation layer to thereby form a nanosheet stack structure which is disposed on the embedded insulation layer;

forming source/drain layers in contact with exposed sidewall surfaces of the active nanosheet channel layers of the nanosheet stack structure;

selectively etching the first epitaxial semiconductor layer and the sacrificial nanosheet layers of the nanosheet stack structure to remove the first epitaxial semiconductor layer and the sacrificial nanosheet layers and thereby release the active nanosheet channel layers; and forming the high-k dielectric/metal gate structure which surrounds the active nanosheet channel layers.

8. The method of claim 7, wherein the first epitaxial semiconductor layer and the sacrificial nanosheet layers are formed of epitaxial silicon germanium, and wherein the active nanosheet layers are formed of epitaxial silicon.

9. A method for fabricating a semiconductor device, comprising:

forming a first epitaxial semiconductor layer on active silicon layer of a semiconductor substrate;

forming a screening layer over the first epitaxial semiconductor layer;

performing an oxygen ion implantation process to form an embedded oxide layer within the active silicon layer below the first epitaxial semiconductor layer;

performing an etch process to remove the screening layer selective to the first epitaxial semiconductor layer;

forming a nanosheet layer stack over the embedded insulation layer, wherein the nanosheet layer stack comprises a plurality of epitaxial semiconductor layers comprising sacrificial nanosheet layers and active nanosheet channel layers, wherein the first epitaxial semiconductor layer comprises a sacrificial nanosheet layer of the nanosheet layer stack;

patterning the nanosheet layer stack down to the embedded oxide layer to thereby form a nanosheet stack structure which is disposed on the embedded oxide layer;

forming source/drain layers in contact with exposed sidewall surfaces of the active nanosheet channel layers of the nanosheet stack structure;

selectively etching the sacrificial nanosheet layers of the nanosheet stack structure to release the active nanosheet channel layers; and forming a high-k dielectric/metal gate structure which surrounds the active nanosheet channel layers;

wherein the embedded oxide layer isolates the high-k dielectric/metal gate structure and the source/drain layers from the semiconductor substrate.

10. The method of claim 9, wherein performing the oxygen ion implantation process to form the embedded oxide layer within the active silicon layer below the first epitaxial semiconductor layer comprises:

performing an oxygen ion implantation process to form an oxygen ion implant region within an upper surface region of the active silicon layer of the semiconductor substrate below the first epitaxial semiconductor layer; and performing a thermal anneal process to convert the oxygen ion implant region to an embedded silicon dioxide layer.

11. The method of claim 10, wherein parameters of the oxygen ion implantation process are configured to form the oxygen ion implant region having an oxygen ion concentration of about $1\times10^{16}$ atoms/cm$^3$ to about $1\times10^{22}$ atoms/cm$^3$.

12. The method of claim 10, wherein the embedded silicon dioxide layer has a thickness in a range of about 5 nm to about 100 nm.

13. The method of claim 9, wherein the screening layer comprises a screening oxide layer formed over the first epitaxial semiconductor layer.

14. The method of claim 13, wherein the screening layer further comprises a screening nitride layer formed over the screening oxide layer.

15. The method of claim 9, wherein the sacrificial nanosheet layers are formed of epitaxial silicon germanium, and wherein the active nanosheet layers are formed of epitaxial silicon.

16. The method of claim 1, further comprising performing an etch process to remove the screening layer selective to the first epitaxial semiconductor layer, prior to forming the nanosheet field-effect transistor device.

17. The method of claim 7, wherein performing the ion implantation process to form the embedded insulation layer within the semiconductor substrate below the first epitaxial semiconductor layer, comprises:

performing an oxygen ion implantation process to form an oxygen ion implant region within an upper surface region of the semiconductor substrate below the first epitaxial semiconductor layer; and performing a thermal anneal process to convert the oxygen ion implant region to an embedded oxide layer;

wherein parameters of the oxygen ion implantation process are configured to form the oxygen ion implant region having an oxygen ion concentration of about $1\times10^{16}$ atoms/cm$^3$ to about $1\times10^{22}$ atoms/cm$^3$.

18. The method of claim 17, wherein the semiconductor substrate comprises a silicon substrate and wherein the embedded oxide layer comprises a silicon oxide layer.

19. The method of claim 17, wherein the embedded oxide layer has a thickness in a range of about 5 nm to about 100 nm.

* * * * *